(12) United States Patent  
Hamada et al.

(10) Patent No.: US 11,130,909 B2  
(45) Date of Patent: Sep. 28, 2021

(54) WAVELENGTH CONVERSION MEMBER, LIGHT SOURCE, ILLUMINATION DEVICE, AND METHOD FOR MANUFACTURING WAVELENGTH CONVERSION MEMBER

(71) Applicant: Panasonic Intellectual Property Management Co., Ltd., Osaka (JP)

(72) Inventors: Takahiro Hamada, Osaka (JP); Yukihiko Sugio, Osaka (JP); Takashi Ohbayashi, Osaka (JP); Yoshihisa Nagasaki, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 44 days.

(21) Appl. No.: 16/635,456

(22) PCT Filed: Aug. 7, 2018

(86) PCT No.: PCT/JP2018/029499  
§ 371 (c)(1),  
(2) Date: Jan. 30, 2020

(87) PCT Pub. No.: WO2019/044409  
PCT Pub. Date: Mar. 7, 2019

(65) Prior Publication Data  
US 2021/0102117 A1 Apr. 8, 2021

(30) Foreign Application Priority Data

Aug. 28, 2017 (JP) .............................. JP2017-163361

(51) Int. Cl.  
*F21V 9/30* (2018.01)  
*F21V 7/06* (2006.01)  
(Continued)

(52) U.S. Cl.  
CPC ............... *C09K 11/02* (2013.01); *C01F 7/02* (2013.01); *C09K 11/7706* (2013.01);  
(Continued)

(58) Field of Classification Search  
None  
See application file for complete search history.

(56) References Cited

U.S. PATENT DOCUMENTS

2014/0001948 A1 1/2014 Katayama et al.  
2014/0071683 A1 3/2014 Hamada  
(Continued)

FOREIGN PATENT DOCUMENTS

CN 103534824 A 1/2014  
CN 105423238 A 3/2016  
(Continued)

OTHER PUBLICATIONS

International Search Report for corresponding Application No. PCT/JP2018/029499, dated Oct. 30, 2018.  
(Continued)

*Primary Examiner* — Ashok Patel  
(74) *Attorney, Agent, or Firm* — Renner, Otto, Boisselle & Sklar, LLP

(57) ABSTRACT

A wavelength conversion device of the present disclosure includes a substrate, a phosphor layer that has a matrix containing zinc oxide and phosphor particles embedded in the matrix and that is supported by the substrate, a dielectric layer disposed between the substrate and the phosphor layer, and a protective layer that is disposed between the phosphor layer and the dielectric layer and that has an isoelectric point equal to or larger than 7. A main surface of the substrate includes, for example, first and second regions. The phosphor layer covers, for example, only the first region out of the first and second regions.

10 Claims, 14 Drawing Sheets

(51) Int. Cl.
*F21V 9/08* (2018.01)
*C09K 11/02* (2006.01)
*C09K 11/77* (2006.01)
*C01F 7/02* (2006.01)
*C30B 28/04* (2006.01)
*C30B 29/16* (2006.01)

(52) U.S. Cl.
CPC .............. *C30B 28/04* (2013.01); *C30B 29/16* (2013.01); *F21V 7/06* (2013.01); *F21V 9/08* (2013.01); *F21V 9/30* (2018.02)

(56) References Cited

U.S. PATENT DOCUMENTS

| | | | |
|---|---|---|---|
| 2016/0077415 A1 | 3/2016 | Motoya | |
| 2017/0023188 A1 | 1/2017 | Mima | |
| 2017/0023199 A1 | 1/2017 | Hamada | |
| 2018/0216800 A1 | 8/2018 | Yamanaka | |
| 2020/0231872 A1* | 7/2020 | Okura | C09K 11/7708 |

FOREIGN PATENT DOCUMENTS

| | | |
|---|---|---|
| JP | 2004-315342 A | 11/2004 |
| JP | 2015-050124 A | 3/2015 |
| JP | 2016-58638 A | 4/2016 |
| JP | 2017-027019 A1 | 2/2017 |
| JP | 2017-028251 A | 2/2017 |
| WO | 2013/172025 A1 | 11/2013 |
| WO | 2017/056470 A1 | 4/2017 |

OTHER PUBLICATIONS

The pH Titrations of Alumina, Silica and Mullite Particles (by Otsuka Electronics Co.,LTD) https://www.otsukael.jp/weblearn/chapter/learnid/70/page/2/categorylid/33 (retrieved Dec. 24, 2019).

Zeta Potentials of Fiber Surfaces (by Otsuka Electronics Co.,LTD) https://www.otsukael.jp/weblearn/chapter/learnid/71/page/1/categorylid/33 (retrieved Dec. 24, 2019).

Zeta Potentials of Polymer Electrolyte Laminated Membranes Formed on Smooth Surfaces (by Otsuka Electronics Co.,LTD) https://www.otsukael.jp/weblearn/chapter/learnid/73/page/2/categorylid/33 (retrieved Dec. 24, 2019).

The Extended European Search Report dated Aug. 13, 2020 for the related European Patent Application No. 18851125.7.

Roman Marsalek: "Particle Size and Zeta Potential of ZnO", 3rd International Conference on Biotechnology and Food Science (ICBFS 2012) Elsevier Science BV, Sara Burgerhartstraat 25, PO Box 211, 1000 AE Amsterdam, Netherlands Series: APCBEE Procedia (ISSN 2212-6708 (Print)), vol. 9, Jan. 1, 2014 (Jan. 1, 2014), pp. 13-17, XP055719751.

English Translation of Chinese Search Report dated Jun. 2, 2021 for the related Chinese Patent Application No. 201880053482.3.

* cited by examiner

FIG. 19        PRIOR ART

WAVELENGTH CONVERSION MEMBER, LIGHT SOURCE, ILLUMINATION DEVICE, AND METHOD FOR MANUFACTURING WAVELENGTH CONVERSION MEMBER

This application is a U.S. national stage application of the PCT international application No. PCT/JP2018/029499 filed on Aug. 7, 2018, which claims the benefit of foreign priority of Japanese patent application No. 2017-163361 filed on Aug. 28, 2017, the contents all of which are incorporated herein by reference.

TECHNICAL FIELD

The present disclosure relates to a wavelength conversion device, a light source, an illumination device, and a method for manufacturing the wavelength conversion device.

BACKGROUND ART

In recent years, a light source including a light emitting element and a wavelength conversion device has been developed. The wavelength conversion device includes phosphor particles embedded in a matrix. The phosphor particles are irradiated with excitation light from the light emitting element, and light having a wavelength longer than the wavelength of the excitation light is radiated from the phosphor. It has been attempted to increase the luminance and output of light in this type of light source.

PTL 1 discloses a wavelength conversion device mainly containing zinc oxide (ZnO) for the matrix. ZnO is an inorganic material having a refractive index close to the refractive indexes of various phosphors, and exhibits excellent translucency and thermal conductivity. In the wavelength conversion device of PTL 1, light scattering at an interface between each phosphor particle and the ZnO matrix is suppressed and high optical output can be achieved.

FIG. 19 is a schematic sectional diagram of a conventional wavelength conversion device disclosed in PTL 2. As illustrated in FIG. 19, PTL 2 discloses wavelength conversion device 400 including substrate 410, $SiO_2$ layer 414, ZnO layer 418, and phosphor layer 420. Phosphor layer 420 includes a matrix made of ZnO. ZnO layer 418 functions as a seed crystal in a crystal growth process of the matrix of phosphor layer 420. ZnO layer 418 is disposed on $SiO_2$ layer 414. $SiO_2$ layer 414 functions as a dielectric layer.

CITATION LIST

Patent Literature

PTL 1: International Publication No. 2013/172025
PTL 2: Japanese Laid-Open Patent Publication No. 2016-58638

SUMMARY

The present disclosure provides a wavelength conversion device including a substrate, a phosphor layer supported by the substrate and including a matrix containing zinc oxide and phosphor particles embedded in the matrix, a dielectric layer disposed between the substrate and the phosphor layer, and a protective layer disposed between the phosphor layer and the dielectric layer, the protective layer having an isoelectric point equal to or larger than 7.

The wavelength conversion device of the present disclosure prevents foreign substances from being attached to the device.

BRIEF DESCRIPTION OF DRAWINGS

FIG. 19 is a schematic sectional diagram of a conventional wavelength conversion device.

Figure 1:
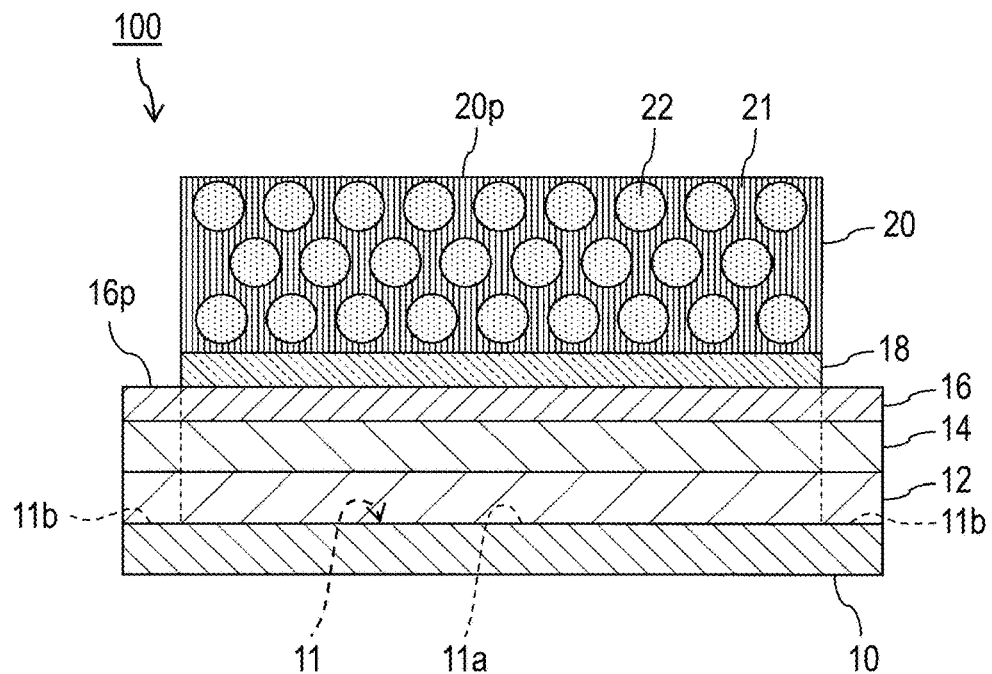
FIG. 1 is a schematic sectional diagram of a wavelength conversion device according to Exemplary Embodiment 1 of the present disclosure.

DETAIL DESCRIPTION OF EMBODIMENTS (Study which the Present Disclosure is Based on)

A conventional wavelength conversion device allows foreign substances generated when the wavelength conversion device is fabricated to be easily attached thereto. The foreign substances attached to a phosphor layer of the wavelength conversion device may adversely affect optical characteristics of the wavelength conversion device. In a case in which the foreign substances are attached to a back surface of a substrate of the wavelength conversion device, the foreign substances enter between the substrate and a support when the wavelength conversion device is disposed in the light source and a surface of the phosphor layer is inclined in some cases. The surface of the phosphor layer inclined provides a problem that desired optical characteristics are not attained. The foreign substances entering between the substrate and the support may provide a problem that the temperature of the phosphor layer rises as the heat dissipation is inhibited. Moreover, the wavelength conversion device of PTL 2 may allow foreign substances which are generated when the wavelength conversion device is fabricated to be attached thereto.

A wavelength conversion device according to a first aspect of the present disclosure includes a substrate, a phosphor layer including a matrix containing zinc oxide and phosphor particles embedded in the matrix and is supported by the substrate, a dielectric layer disposed between the substrate and the phosphor layer, and a protective layer disposed between the phosphor layer and the dielectric layer and has an isoelectric point equal to or larger than 7.

According to the first aspect, the protective layer is disposed between the phosphor layer and the dielectric layer. The protective layer suppresses foreign substances generated when the wavelength conversion device is fabricated. For this reason, attachment of foreign substances is suppressed in the wavelength conversion device. The protective layer prevents the phosphor layer from being peeled off from the substrate.

In a second aspect of the present disclosure, for example, a main surface of the substrate of the wavelength conversion device according to the first aspect includes a first region and a second region. Each of the dielectric layer and the protective layer covers the first region and the second region. The phosphor layer covers only the first region out of the first region and the second region. According to the second aspect, foreign substances are prevented from being attached in the wavelength conversion device.

In a third aspect of the present disclosure, for example, the protective layer of the wavelength conversion device according to the first or second aspect contains at least one selected from the group consisting of $Al_2O_3$, $Si_3N_4$, $Y_2O_3$, $NiO$, and $La_2O_3$. According to the third aspect, foreign substances are prevented from being attached in the wavelength conversion device.

In a fourth aspect of the present disclosure, for example, the protective layer of the wavelength conversion device according to the third aspect mainly contains $Al_2O_3$. According to the fourth aspect, foreign substances are prevented from being attached in the wavelength conversion device. According to the protective layer, the phosphor layer is prevented from being peeled off from the substrate.

In a fifth aspect of the present disclosure, for example, the wavelength conversion device according to any one of the first to fourth aspects further includes a metal layer disposed between the substrate and the dielectric layer. According to the fifth aspect, the wavelength conversion device is suitable for a reflective light source.

In a sixth aspect of the present disclosure, for example, the thickness of the protective layer of the wavelength conversion device according to any one of the first to fifth aspects is equal to or larger than 5 nm and equal to or smaller than 200 nm. According to the sixth aspect, the protective layer is sufficiently thin and provides a high luminous efficiency.

A light source according to a seventh aspect of the present disclosure includes a light emitting element and the wavelength conversion device according to any one of the first to sixth aspects. The wavelength conversion device is configured to receive excitation light emitted from the light emitting element and radiate fluorescence.

According to the seventh aspect, foreign substances are prevented from being attached in the wavelength conversion device. This provides a light source exhibiting desired optical characteristics.

An illumination device according to an eighth aspect of the present disclosure includes the light source according to the seventh aspect and an optical component configured to guide light radiated from the light source to the outside.

According to the eighth aspect, an illumination device exhibiting desired optical characteristics is provided.

The wavelength conversion device according to a ninth aspect of the present disclosure is manufactured by the following method. A substrate having a main surface that is an upper surface is prepared. The surface of the substrate includes first regions and a second region. Each of the plurality of first regions and the second region is covered with a dielectric layer. A protective layer that covers the first regions and the second region is formed. Phosphor layers are formed above the first regions, respectively. The phosphor layers include matrixes containing zinc oxide, respectively. Each matrix has phosphor particles embedded therein. The substrate, the dielectric layer, and the protective layer are cut along cutting lines provided in the second region so as to separate that the phosphor layers from each other.

According to the ninth aspect, foreign substances are prevented from being generated. This prevents the foreign substances from being attached in the wavelength conversion device.

In a tenth aspect of the present disclosure, for example, the forming of the phosphor layers in the manufacturing method of the ninth aspect includes forming seed crystal layers containing zinc oxide on the protective layer such that the first regions are covered, disposing the phosphor particles on the seed crystal layers, and growing crystals of the seed crystal layers to provide the matrixes. According to the tenth aspect, foreign substances are prevented from being attached in the wavelength conversion device.

In an eleventh aspect of the present disclosure, for example, the crystal growth in the manufacturing method according to the tenth aspect is performed by a solution growth method. According to the eleventh aspect, foreign substances are prevented from being attached in the wavelength conversion device.

Exemplary embodiments of the present disclosure will be described below with reference to the drawings. The present disclosure is not limited to the following embodiments.

Exemplary Embodiment 1

FIG. 1 is a schematic sectional diagram of wavelength conversion device 100 according to a first exemplary embodiment of the present disclosure. As illustrated in FIG. 1, wavelength conversion device 100 according to the present first exemplary embodiment includes substrate 10, dielectric layer 14, protective layer 16, and phosphor layer 20. Wavelength conversion device 100 may further include metal layer 12 and seed crystal layer 18. Substrate 10 supports metal layer 12, dielectric layer 14, protective layer 16, seed crystal layer 18, and phosphor layer 20. In the thickness direction of substrate 10, substrate 10, metal layer 12, dielectric layer 14, protective layer 16, seed crystal layer 18, and phosphor layer 20 are arranged in this order. Dielectric layer 14 is disposed between substrate 10 and phosphor layer 20. Protective layer 16 is disposed between dielectric layer 14 and phosphor layer 20. Metal layer 12 is disposed between substrate 10 and dielectric layer 14. Seed crystal layer 18 is disposed between protective layer 16 and phosphor layer 20.

Substrate 10 has, for example, a rectangular shape in plan view. Main surface 11 of substrate 10 includes first region 11a and second region 11b. Main surface 11 is a surface having the largest area in substrate 10. First region 11a has, for example, a circular shape in plan view. First region 11a may have another shape. First region 11a may have an elliptical shape or may have a polygonal shape in plan view. The polygonal shape may be a square, a hexagon, and the like. First region 11a may have a ring or fan shape in plan view. Second region 11b is a region adjacent to first region 11a. Second region 11b is, for example, an annular region that surrounds first region 11a. In this case, second region 11b is located on the outer side than first region 11a in main surface 11 of substrate 10. In the case that first region 11a has a ring shape, second region 11b is formed on each of the inner side and outer side of first region 11a in plan view.

Metal layer 12, dielectric layer 14, protective layer 16, seed crystal layer 18, and phosphor layer 20 cover main surface 11 of substrate 10. Specifically, each of metal layer 12, dielectric layer 14, and protective layer 16 covers first region 11a and second region 11b of main surface 11. Seed crystal layer 18 and phosphor layer 20 cover only first region 11a out of first region 11a and second region 11b.

Metal layer 12 directly contacts substrate 10. Metal layer 12 may contact substrate 10 via another thin film in between. Another thin film is made of, for example, oxide or metal. Metal layer 12 contacts dielectric layer 14. Dielectric layer 14 contacts metal layer 12 and protective layer 16. Protective layer 16 contacts dielectric layer 14 and seed crystal layer 18. Phosphor layer 20 contacts seed crystal layer 18. Protective layer 16 covers the entire surface of dielectric layer 14. Seed crystal layer 18 partially covers surface 16p of protective layer 16. Surface 20p of phosphor layer 20 and a part of surface 16p of protective layer 16 constitute the outermost surface of wavelength conversion device 100. In plan view of wavelength conversion device 100, surface 20p of phosphor layer 20 and a part of surface 16p of protective layer 16 are observed.

Phosphor layer 20 includes matrix 21 and phosphor particles 22. Matrix 21 exists between the particles. Phosphor particles 22 are embedded in matrix 21. In other words, phosphor particles 22 are dispersed in matrix 21.

When wavelength conversion device 100 is irradiated with excitation light within a first wavelength band, wavelength conversion device 100 converts part of the excitation light into light having a second wavelength band and radiates the light. Wavelength conversion device 100 radiates light having a wavelength longer than the wavelength of the excitation light. The second wavelength band is different from the first wavelength band. However, part of the second wavelength band may overlap the first wavelength band. The light radiated from wavelength conversion device 100 may include not only the light radiated from phosphor particles 22 but also the excitation light itself.

The thickness of substrate 10 is, for example, larger than the thickness of phosphor layer 20. Substrate 10 is made of at least one material selected from the group consisting of single-crystalline sapphire ($Al_2O_3$), polycrystalline alumina ($A_2O_3$), gallium nitride (GaN), aluminum nitride (AlN), silicon, aluminum, glass, quartz ($SiO_2$), silicon carbide (SiC), and zinc oxide. Substrate 10 may exhibit translucency for the excitation light and the light radiated from phosphor particles 22. Substrate 10 does not necessarily exhibit translucency for the excitation light and the light radiated from phosphor particles 22. Substrate 10 may have a mirror-polished surface.

Metal layer 12 is a layer reflecting light. For this reason, wavelength conversion device 100 including metal layer 12 may be suitably used for a reflective light source. The thickness of metal layer 12 is, for example, smaller than the thickness of phosphor layer 20. Metal layer 12 contains metallic material. The metallic material contains at least one selected from the group consisting of, for example, silver and aluminum.

Dielectric layer 14 contains dielectric material. The dielectric material is generally a material having a wide bandgap. Light absorption by the dielectric material is small, and the dielectric material is transparent to the visible light region. For this reason, in the case that dielectric layer 14 has a thin film shape, dielectric layer 14 is suitably used as an optical thin film. The visible light region means a range of wavelengths of light that can be perceived by the human eye among electromagnetic waves. In the visible light region, the wavelength of light ranges, for example, from 360 nm to 830 nm. A dielectric material having a small light absorption in the wavelength band of the excitation light emitted from the excitation light source as well as in the visible light region is suitably used as a material of dielectric layer 14.

For example, dielectric layer 14 of wavelength conversion device 100 that can be used in a reflective light source functions as a reflection-enhancing film for increasing the light reflectance of metal layer 12. In this case, dielectric layer 14 efficiently reflects the excitation light and the light radiated from phosphor particles 22.

The dielectric material contains at least one selected from the group consisting of, for example, titanium oxide, zirconium oxide, tantalum oxide, cerium oxide, niobium oxide, tungsten oxide, silicon oxide, and magnesium fluoride. Dielectric layer 14 may be made of silicon oxide. Dielectric layer 14 may include plural films. In other words, films may be layered in dielectric layer 14. The films have different compositions. Each of the films contains dielectric material. A film among the plurality of films other than the film farthest from substrate 10 (the film closest to protective layer 16) may contain aluminum oxide. A high luminous efficiency can be achieved by appropriately selecting the composition and thickness of the films.

Protective layer 16 is not particularly limited as long as it has an isoelectric point equal to or larger than 7. The material of protective layer 16 may be a material having a wide bandgap. The material of protective layer 16 may be a material that has low light absorption and is transparent to the visible light region. In this case, a high luminous efficiency can be achieved and it can be suppressed that the luminescence characteristics of wavelength conversion device 100 are impaired. However, even when the material of protective layer 16 has light absorption in the visible light region, the influence on the luminescence characteristics can be suppressed by decreasing the thickness of protective layer 16. A material having a small light absorption in the wavelength band of the excitation light emitted from the excitation light source as well as in the visible light region is suitably used as the material of protective layer 16.

Protective layer 16 contains at least one selected from the group consisting of, for example, $Al_2O_3$, $Si_3N_4$, $Y_2O_3$, NiO, and $La_2O_3$. Protective layer 16 may contain at least one selected from the group consisting of MgO, CuO, PbO, and $Tl_2O$. Protective layer 16 may contain any one selected from the group consisting of $Al_2O_3$, $Si_3N_4$, $Y_2O_3$, NiO, and $La_2O_3$ as a main component. The "main component" means a component that is contained in protective layer 16 in the largest amount in volume. Protective layer 16 does not contain, for example, each of $SiO_2$ and ZnO as a main component. Protective layer 16 may contain $Al_2O_3$ as a main component. $Al_2O_3$ contained in protective layer 16 is, for example, polycrystalline $Al_2O_3$ or amorphous $Al_2O_3$. $Al_2O_3$ contained in protective layer 16 may be single-crystalline $Al_2O_3$. $Al_2O_3$ contained in protective layer 16 may be $\alpha$-$Al_2O_3$, $\gamma$-$Al_2O_3$, $\theta$-$Al_2O_3$, $\kappa$-$Al_2O_3$, or $\varepsilon$-$Al_2O_3$. As the content of $Al_2O_3$ in protective layer 16 is higher, the adhesive property between protective layer 16 and seed crystal layer 18 is improved. In other words, as the content of $Al_2O_3$ in protective layer 16 is higher, phosphor layer 20 is accordingly prevented from being peeled off from substrate 10. Protective layer 16 may be substantially made of $Al_2O_3$. "To be substantially made of" means to exclude other components which alter the essential features of the mentioned compound. However, protective layer 16 may contain impurities in addition to $Al_2O_3$.

Furthermore, as a characteristic of protective layer 16, the isoelectric point of protective layer 16 may range from 7 to 14. The isoelectric point of protective layer 16 can be measured by the following method. Liquid containing water contacts a surface of protective layer 16. The zeta potential on the surface of protective layer 16 is measured. The zeta potential may be measured, for example, with a commercially available zeta potential measuring apparatus. The pH value of the liquid when the zeta potential on the surface of protective layer 16 becomes zero can be regarded as the isoelectric point of protective layer 16. The isoelectric point of protective layer 16 is determined in accordance with the composition of protective layer 16. For this reason, the isoelectric point of protective layer 16 may be measured by the following method. First, particles having the same composition as protective layer 16 are prepared. The particles are dispersed in liquid containing water. The zeta potential of the particles is measured. The pH value of the liquid when the zeta potential of the particles becomes zero can be regarded as the isoelectric point of protective layer 16.

As an example, the isoelectric point of $\alpha$-$Al_2O_3$ typically ranges from 8 to 9. The isoelectric point of $\gamma$-$Al_2O_3$ typically ranges from 7 to 8. The isoelectric point of $Si_3N_4$ is typically 9. The isoelectric point of $Y_2O_3$ typically ranges from 7.15 to 8.95. The isoelectric point of NiO typically ranges from 10 to 11. The isoelectric point of $La_2O_3$ is typically 10. The isoelectric point of MgO is typically 12 to 13. The isoelectric point of CuO is typically 9.5. The isoelectric point of PbO typically ranges from 10.7 to 11.6. The isoelectric point of $Tl_2O$ is typically 8. These materials are suitable as the material of protective layer 16.

As an example, the isoelectric point of $SiO_2$ typically ranges from 1.7 to 3.5. The isoelectric point of $Ta_2O_5$ typically ranges from 2.7 to 3.0. The isoelectric point of SiC typically ranges from 2 to 3.5. The isoelectric point of $WO_3$ typically ranges from 0.2 to 0.5. These materials are not suitable as the material of protective layer 16. However, these materials may be contained in protective layer 16 as long as the isoelectric point of protective layer 16 is equal to or larger than 7. $SiO_2$ and $Ta_2O_5$ are often used as the material of the dielectric layer.

The thickness of protective layer 16 may be equal to or larger than 5 nm and equal to or smaller than 400 nm, or equal to or larger than 5 nm and equal to or smaller than 200 nm, or equal to or larger than 5 nm and equal to or smaller than 100 nm. As protective layer 16 is thinner, a higher luminous efficiency can be achieved. As protective layer 16 is thinner, the distance between phosphor layer 20 and substrate 10 decreases, accordingly allowing protective layer 16 to exhibit more excellent thermal conductivity. The thickness of protective layer 16 may be equal to or less than 50 nm, or equal to or less than 20 nm.

Seed crystal layer 18 functions as a base layer for forming phosphor layer 20. In other words, seed crystal layer 18 functions as a seed crystal in the crystal growth process of matrix 21. As seed crystal layer 18, for example, crystalline ZnO is suitably used. In the case that seed crystal layer 18 is composed of polycrystalline ZnO, matrix 21 can be polycrystalline ZnO. Other elements may be added to ZnO contained in seed crystal layer 18. In the case that elements, such as Ga, Al, and B, are added to ZnO, ZnO has a low electrical resistance. The material of seed crystal layer 18 is not particularly limited as long as seed crystal layer 18 functions as a seed crystal of matrix 21. Seed crystal layer 18 may contain amorphous Zn compounds formed from zinc compounds and the like or amorphous ZnO. Seed crystal layer 18 may contain materials other than ZnO. As the shape of seed crystal layer 18, a thin film shape is suitable. The shape of seed crystal layer 18 is not particularly limited as long as seed crystal layer 18 functions as a seed crystal of matrix 21. The shape of seed crystal layer 18 may be a discontinuous shape, such as particles. The thickness of seed crystal layer 18 may be equal to or larger than 5 nm and equal to or smaller than 2000 nm, or equal to or larger than 5 nm and equal to or smaller than 200 nm. As seed crystal layer 18 is thinner, the distance between phosphor layer 20 and substrate 10 is shorter, and thus more excellent thermal conductivity is attained.

In phosphor layer 20, phosphor particles 22 are dispersed in matrix 21. In FIG. 1, phosphor particles 22 are separated from each other. However, phosphor particles 22 may contact each other. Phosphor particles 22 may be stacked like a stone wall.

Phosphor particles 22 receive excitation light and radiate fluorescence. The material of phosphor particles 22 is not particularly limited. Various fluorescent substances may be used as the material of phosphor particles 22. Specifically, fluorescent substances, such as $YaAl_5O_{12}$:Ce(YAG), $Y_3(Al,Ga)_5O_{12}$:Ce(GYAG), $Lu_3Al_5O_{12}$:Ce(LuAG), $(Si,Al)_6(O,N)_8$:Eu($\beta$-SiAlON), $(La,Y)_3Si_6N_{11}$:Ce(LYSN), and $Lu_2CaMg_2Si_3O_{12}$:Ce(LCMS), can be used. Phosphor particles 22 may contain plural kinds of phosphor particles having different compositions. The material of phosphor particles 22 is selected in accordance with the chromaticity of light that is to be radiated from wavelength conversion device 100.

The average particle diameter of phosphor particles 22 ranges, for example, from 0.1 μm to 50 μm. The average particle diameter of phosphor particles 22 can be specified by, e.g. the following method. First, the cross section of wavelength conversion device 100 is observed with a scanning electron microscope. In the electron microscope image attained, the area of specific phosphor particle 22 is calculated by image processing. The diameter of a circle having the same area as the calculated area is regarded as the particle diameter (diameter of particle) of specific phosphor particle 22. The particle diameters of a certain number (for example, fifty) of phosphor particles 22 are calculated, and the average value of the calculated values is regarded as the average particle diameter of phosphor particles 22. In the present disclosure, the shape of phosphor particles 22 is not limited. The shape of phosphor particles 22 may be a spherical shape, a scale shape, or a fibrous shape. In the present disclosure, the method for measuring the average particle diameter is not limited to the above method.

Matrix 21 contains ZnO. ZnO is suitable as the material of matrix 21 in transparency and thermal conductivity. ZnO exhibits high thermal conductivity. Hence, in the case that ZnO is used as the material of matrix 21, the heat of phosphor layer 20 can be easily released to the outside. Matrix 21 may contain ZnO as a main component. Matrix 21 may be made substantially of ZnO. However, matrix 21 may contain impurities in addition to ZnO.

In detail, ZnO as the material of matrix 21 is single-crystalline ZnO or polycrystalline ZnO. ZnO has a wurtzite crystal structure. When matrix 21 is formed by crystal growth, matrix 21 has a crystal structure corresponding to the crystal structure of seed crystal layer 18. In other words, in the case that polycrystalline ZnO oriented in a c-axis is used as seed crystal layer 18, matrix 21 has polycrystalline ZnO oriented in a c-axis. "ZnO oriented in a c-axis" means that a plane parallel to main surface 11 of substrate 10 is the c-plane. In the case that matrix 21 contains polycrystalline ZnO oriented in a c-axis, light scattering is suppressed inside phosphor layer 20 and high optical output can be achieved.

Polycrystalline ZnO oriented in a c-axis contains columnar crystal grains oriented in a c-axis. In polycrystalline ZnO oriented in a c-axis, there are few crystal grain boundaries in the c-axis direction. The fact that "columnar crystal grains are oriented in the c-axis" means that the growth of ZnO in the c-axis direction is faster than the growth of ZnO in the a-axis direction and vertically-elongated ZnO crystal grains are formed on substrate 10. The c-axis of ZnO crystal grain is parallel to the normal direction of substrate 10. Whether ZnO is a c-axis oriented crystal or not can be confirmed by XRD (x-ray diffraction) measurement (2θ/ω scan). It can be judged that ZnO is a c-axis oriented crystal if the diffraction peak attributed to the c-plane of ZnO has a greater intensity than the diffraction peak attributed to planes other than the c-plane of ZnO in the diffraction peak of ZnO attained from the XRD measurement result. PTL 1 (International Publication No. 2013/172025) discloses a matrix composed of c-axis-oriented polycrystalline ZnO in detail.

Phosphor layer 20 may further include filler particles. In phosphor layer 20, the filler particles are dispersed in matrix 21. When filler particles are irradiated with excitation light, the filler particles do not radiate fluorescent light or radiate only fluorescent light with a negligible intensity. The material, shape, and added amount of filler particles are appropriately adjusted in accordance with the required chromaticity.

The filler particles are, for example, inorganic particles and typically contain a metal oxide. The filler particles may be made substantially of a metal oxide. Various metal oxides are chemically stable and hardly radiate fluorescence and thus are suitable as material of filler particles. In an example, the filler particles contain at least one selected from $Al_2O_3$ particles, $SiO_2$ particles, or $TiO_2$ particles.

The average particle diameter of the filler particles ranges, for example, from 0.1 μm to 20 μm. The average particle diameter of the filler particles is, for example, smaller than the average particle diameter of phosphor particles 22. The ratio (D2/D1) of average particle diameter D2 of filler particles to average particle diameter D1 of phosphor particles 22 ranges, for example, from 0.01 to 0.90. The average particle diameter of filler particles may be measured by the same method as the average particle diameter of phosphor particles 22. The shape of the filler particles may be a spherical shape, a scale shape, or a fibrous shape. The volume V1 of phosphor particles 22 and the volume V2 provides the value of V2/(V1+V2) ranging, for example, from 0.1 to 0.9.

A method for manufacturing wavelength conversion device 100 will be described below. FIG. 2 and FIGS. 3A to 3I illustrate the method for manufacturing wavelength conversion device 100.

Figure 2:
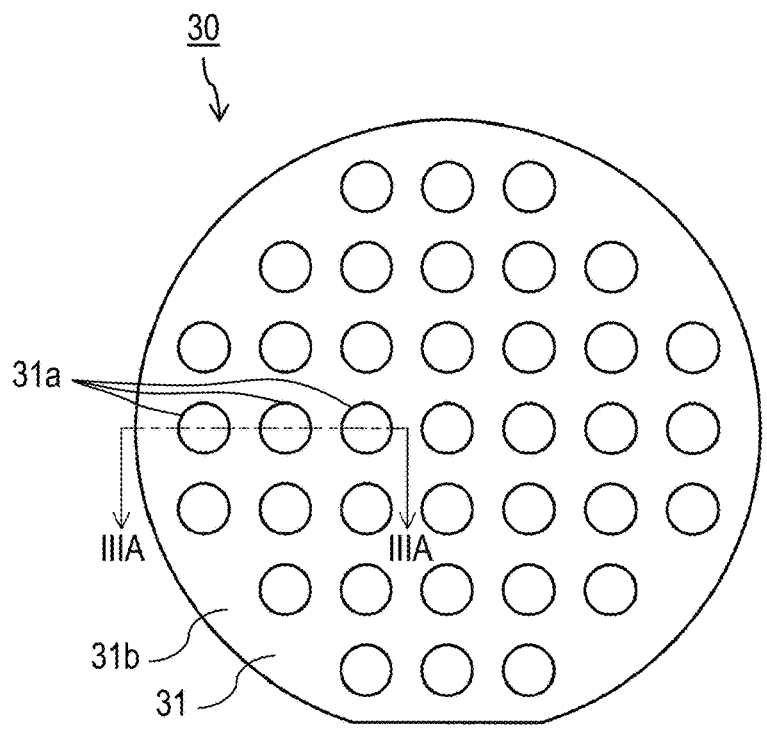
FIG. 2 is a plan view of a substrate used in a method for manufacturing the wavelength conversion device according to Embodiment 1 of the disclosure.
Figure 3A:
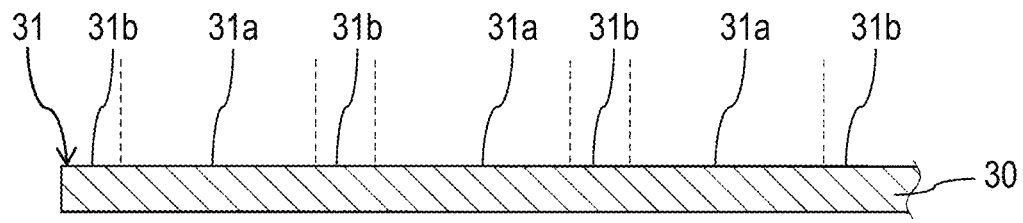
FIG. 3A is a sectional diagram of the substrate along line IIIA-IIIA illustrated in FIG. 2.

First, substrate 30 is prepared as illustrated in FIG. 2 and FIG. 3A. FIG. 3A is a sectional diagram of substrate 30 along line IIIA-IIIA illustrated in FIG. 2. The material of substrate 30 is the same as substrate 10 described above. In FIG. 3A, the upper surface which is main surface 31 of substrate 30 includes plural first regions 31a and second region 31b. Second region 31b surrounds each of first regions 31a. Each first region 31a has, for example, a circular shape in plan view.

Figure 3B:
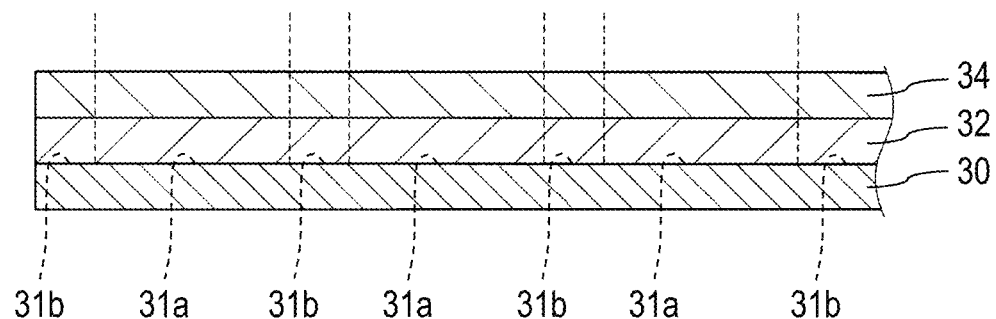
FIG. 3B illustrates a metal layer and a dielectric layer which are disposed on the substrate illustrated in FIG. 3A.

Next, as illustrated in FIG. 3B, first regions 31a and second region 31b are covered with metal layer 32. In detail, metal layer 32 is formed on substrate 30. The material of metal layer 32 is the same as metal layer 12 described above. As a method for forming metal layer 32, vapor phase film formation methods, such as a vapor deposition method, an electron beam vapor deposition method, a reactive plasma vapor deposition method, an ion-assisted vapor deposition method, a sputtering method, and a pulse laser deposition method are used. Next, first regions 31a and second region 31b are covered with dielectric layer 34. In detail, dielectric layer 34 is formed on metal layer 32. The material of dielectric layer 34 is the same as dielectric layer 14 described above. As a method for forming dielectric layer 34, the above-described vapor phase film formation methods can be utilized. Dielectric layer 34 can also be formed by the following method, for example. First, a sol containing a precursor of dielectric material is prepared. The sol is applied to metal layer 32 so that a coating film is formed on metal layer 32. Dielectric layer 34 is obtained by gelling and firing the coating film. A commercially available product being a layered body including substrate 30, metal layer 32, and dielectric layer 34 may be used.

Figure 3C:
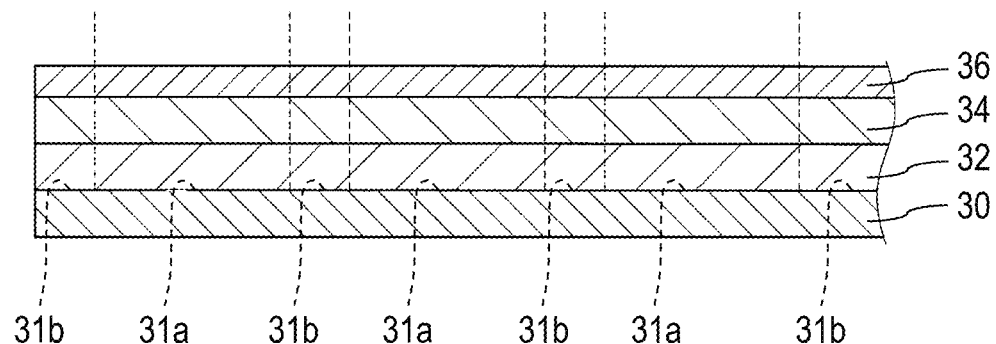
FIG. 3C illustrates a protective layer disposed on the dielectric layer illustrated in FIG. 3B.

Next, as illustrated in FIG. 3C, first regions 31a and second region 31b are covered with protective layer 36. In detail, protective layer 36 is formed on dielectric layer 34. The material of protective layer 36 is the same as the material of protective layer 16 described above. As a method for forming protective layer 36, the above-described vapor phase film formation methods can be utilized. Alternatively, protective layer 36 can be formed by the following method, for example. First, a sol containing a precursor, such as aluminum alkoxide, is prepared. The sol is applied to dielectric layer 34 so that a coating film is formed on dielectric layer 34. Protective layer 36 is obtained by gelling and firing the coating film.

Figure 3D:
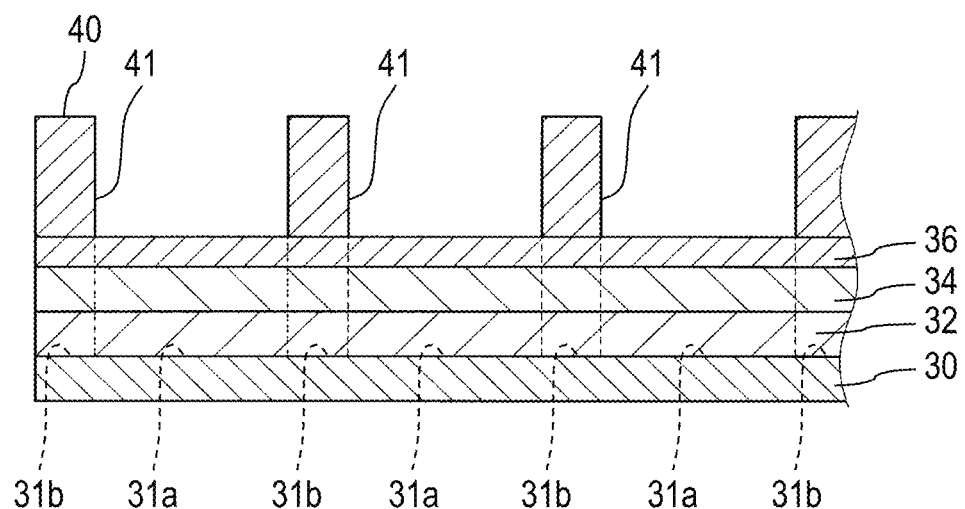
FIG. 3D illustrates a mask disposed on the protective layer illustrated in FIG. 3C.

Next, as illustrated in FIG. 3D, mask 40 is disposed on protective layer 36. Mask 40 is made of metal material, such as stainless steel. Mask 40 has openings 41 provided therein. Openings 41 are through holes which pass through mask 40 in the thickness direction. Openings 41 overlap first regions 31a, respectively. In other words, mask 40 covers second region 31b. The surface of protective layer 36 is exposed to the outside through openings 41. The thickness of mask 40 is determined, for example, in accordance with the thicknesses of seed crystal layer 18 and phosphor layer 20 to be fabricated.

Figure 3E:
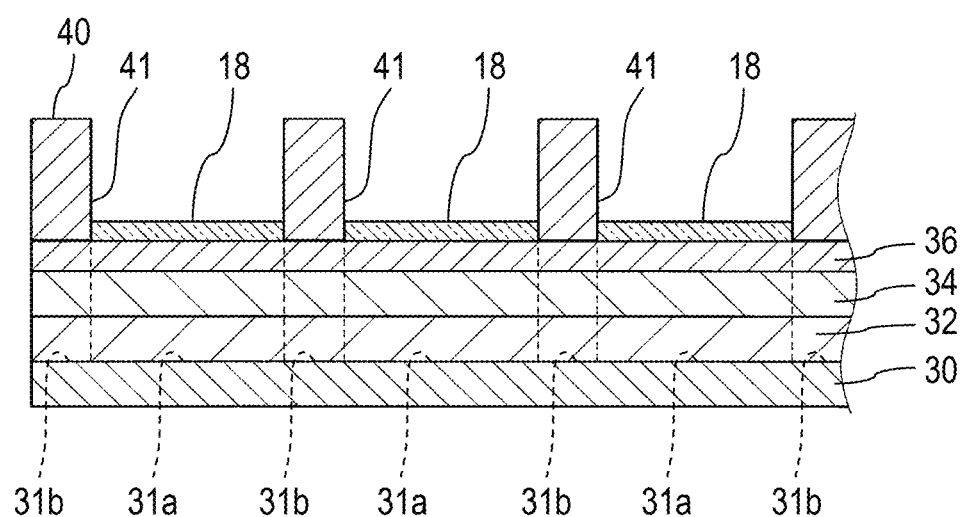
FIG. 3E illustrates plural of seed crystal layers disposed on the protective layer illustrated in FIG. 3D.

Next, as illustrated in FIG. 3E, seed crystal layers 18 are formed in openings 41, respectively. Seed crystal layers 18 can be thus formed over first regions 31a, respectively. Each seed crystal layer 18 is, for example, a crystalline ZnO thin film. As a method for forming seed crystal layers 18, the above-described vapor phase film formation methods can be utilized. Alternatively, seed crystal layers 18 can be formed by the following method. First, a sol containing a precursor, such as zinc alkoxide, is prepared. The sol is applied into the plurality of openings 41 by a printing method to form coating films. Next, the coating films are subjected to a heat treatment. Seed crystal layers 18 are thus obtained. The temperature for the heat treatment may range from 200° C. to 400° C. The temperature for the heat treatment may be equal to or higher than 300° C. The crystallinity of seed crystal layer 18 changes in accordance with the temperature for the heat treatment. When the temperature for the heat treatment is low, a seed crystal with low crystallinity is obtained. When the temperature for the heat treatment is high, a seed crystal with high crystallinity is obtained.

Figure 3F:
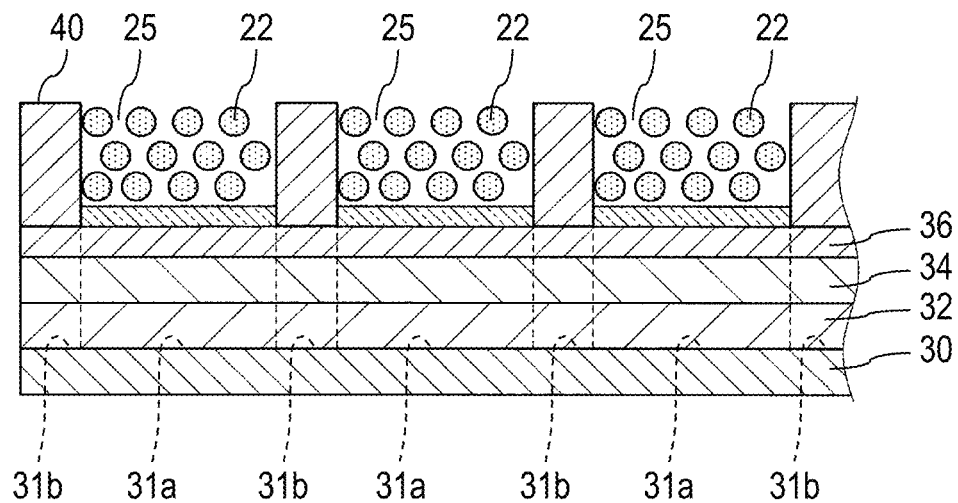
FIG. 3F illustrates precursor layers of phosphor layers formed on the seed crystal layers illustrated in FIG. 3E.

Next, as illustrated in FIG. 3F, precursor layers 25 of phosphor layers are formed in openings 41 respectively. Precursor layer 25 contains phosphor particles 22. Precursor layers 25 are disposed on seed crystal layers 18, respectively. In other words, phosphor particles 22 are disposed on seed crystal layers 18. Precursor layers 25 cover first regions 31a respectively.

Precursor layers 25 can also be formed by the following method. A dispersion solution containing phosphor particles 22 is prepared. Substrate is disposed in the dispersion solution, and phosphor particles 22 are deposited on seed crystal layers 18 by electrophoresis. Precursor layers 25 can be thus formed on seed crystal layers 18. Precursor layers 25 may be formed on seed crystal layers 18 by disposing substrate 30 in the dispersion solution and precipitating phosphor particles 22. Precursor layers 25 may be formed on seed crystal layers 18 by a thick film forming method, such as a printing method using a coating liquid containing phosphor particles 22.

Figure 3G:
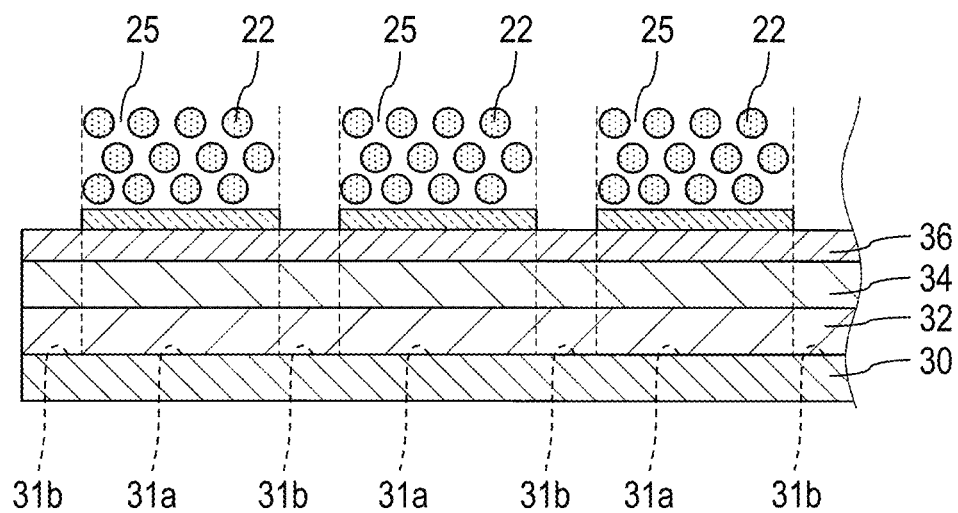
FIG. 3G illustrates the device illustrated in FIG. 3F with the mask removed.
Figure 3H:
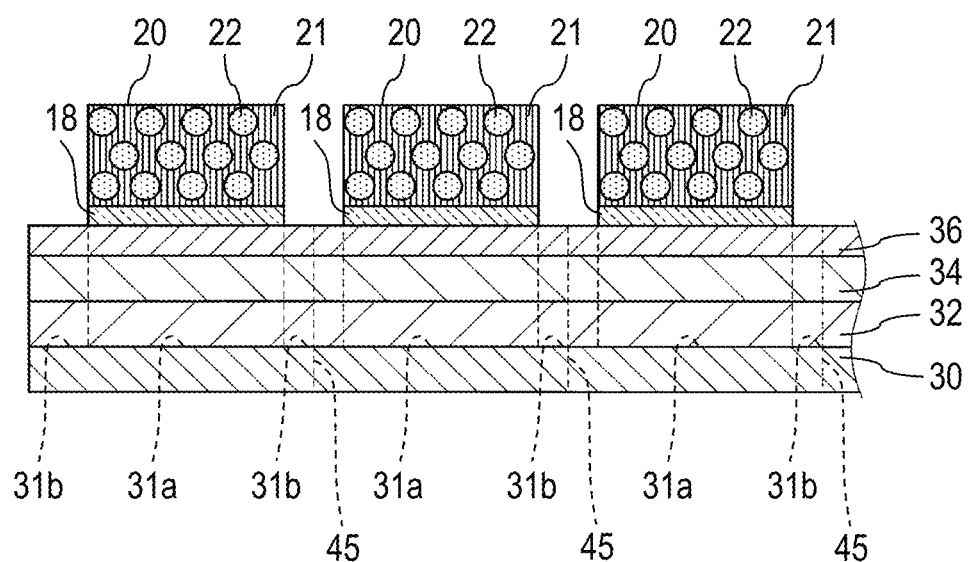
FIG. 3H illustrates a matrix formed on the seed crystal layers illustrated in FIG. 3G.
Figure 3I:
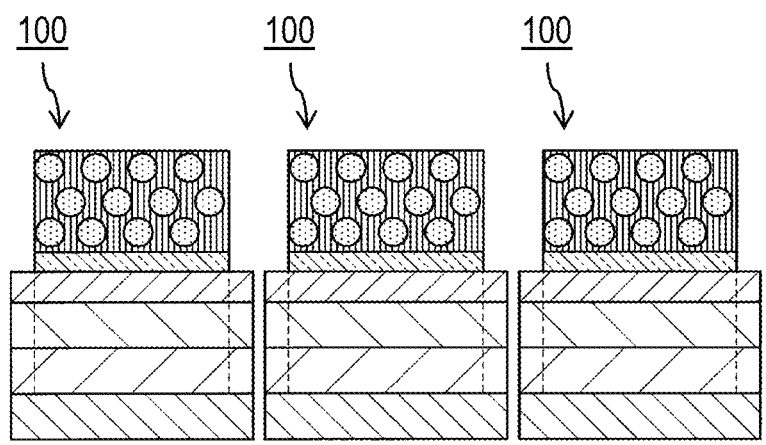
FIG. 3I illustrates a substrate, the metal layer, the dielectric layer, and the protective layer cut along plural cutting lines illustrated in FIG. 3H.

Next, as illustrated in FIG. 3G, mask 40 is removed. Next, as illustrated in FIG. 3H, matrix 21 is formed between phosphor particles 22. As a method for forming matrix 21, a solution growth method using a solution containing Zn ions can be utilized. As the solution growth method, chemical bath deposition performed at the atmospheric pressure, hydrothermal synthesis performed at a pressure equal to or more than the atmospheric pressure, and electrochemical deposition in which a voltage or a current is applied, and the like are used. As the solution for crystal growth, for example, an aqueous solution of zinc nitrate $(Zn(NO_3)_2)$ containing hexamethylenetetramine $(C_6H_{12}N_4)$ is used. The pH value of the aqueous solution of zinc nitrate is, for example, equal to or larger than 5 and equal to or smaller than 7. Details of the solution growth method are disclosed in, for example, Japanese Patent Laid-Open Publication No. 2004-315342. Crystals of matrixes 21 can be grown on seed crystal layers 18 by the solution growth method. Phosphor layers 20 can be thus formed over first regions 31a. Phosphor layers 20 cover first regions 31a, respectively.

A reason why matrix 21 is formed after mask 40 is removed will be described below. In a case that the solution is heated to form matrix 21, bubbles may be generated in the solution. The bubbles generated in the solution may be attached to opening 41 of mask 40. In a case that the bubbles attached to opening 41 are attached to precursor layer 25, Zn ions in the solution as a raw material are not sufficiently supplied to precursor layer 25. This may provide the phosphor layer with defects.

Next, excess phosphor particles 22 are removed. The excess phosphor particles 22 mean phosphor particles 22 that are not embedded in matrix 21. Excess phosphor particles 22 can be removed by, for example, a method to physically wipe the surface of phosphor layer 20 with a sponge and the like, a method in which polishing and removing is performed using a polishing film and the like, or a method in which a washing operation is performed. In the washing operation, excess phosphor particles 22 may be washed with pure water or ultrasonic waves may be utilized.

Next, substrate 30, metal layer 32, dielectric layer 34, and protective layer 36 are cut along cutting lines 45. Phosphor layers 20 are thus separated from each other. As illustrated in FIG. 3, wavelength conversion device 100 is obtained by cutting substrate 30, metal layer 32, dielectric layer 34, and protective layer 36. Cutting lines 45 are defined in second region 31b. Cutting lines 45 extend in the thickness direction of substrate 30. Each cutting line 45 may be defined around the boundary between first regions 31a and second region 31b. In this case, substrate 10 of wavelength conversion device 100 obtained does not have second region 11b. Substrate 30, metal layer 32, dielectric layer 34, and protective layer 36 may be cut, for example, with a commercially available cutting machine. In detail, substrate 30 and the like can be cut with a dicing apparatus with a dicing blade or a laser processing apparatus using laser light.

A conventional wavelength conversion device does not include a protective layer. For this reason, when the matrix is formed by the solution growth method, the solution for crystal growth contacts the surface of the dielectric layer. At this moment, ZnO particles may be formed on the dielectric layer. The area of the ZnO particles, when viewed in plan is, for example, ranges from 314 $\mu m^2$ to 31400 $\mu m^2$. When ZnO particles are cut together with the dielectric layer, part of the ZnO particles are scattered. The scattered part of the ZnO particles are attached to the wavelength conversion device as foreign substances. The foreign substances attached to the phosphor layer of the wavelength conversion device may adversely affect the optical characteristics of the wavelength conversion device. In a case that the foreign substances are attached to the substrate of the wavelength conversion device, the foreign substances may enter in between the substrate and the support when the wavelength conversion device is disposed in a light source and the surface of the phosphor layer is inclined. When the foreign substances enter in between the substrate and the support, the foreign substances prevent heat dissipation, and may raise the temperature of the phosphor layer accordingly.

The ZnO particles are formed as follows. When the solution growth method is performed, crystal nuclei of ZnO are formed in the solution for crystal growth. Crystal nuclei in the solution are attached to the surface of the dielectric layer. ZnO particles are formed on the surface of the dielectric layer as crystals grow from the crystal nuclei.

In a case that the ZnO thin film covers not only the first regions but also the second region, the ZnO thin film, may suppress the generation of ZnO particles. However, in this case, the matrix formed by the solution growth method covers the first regions and the second region. Part of the material of the matrix is scattered as the matrix is cut together with the substrate. The scattered part of the material of the matrix is attached to the wavelength conversion device as foreign substances. When the substrate is cut, the phosphor layer may be cracked. Cutting of the dielectric layer or matrix is specifically disclosed in none of PTLs 1 and 2.

In the manufacturing method of the embodiment, the solution for crystal growth does not contact dielectric layer 34 and prevents the ZnO particles from being formed. In detail, the isoelectric point of protective layer 36 is equal to or larger than 7 and prevents ZnO particles from being formed. In other words, the isoelectric point of ZnO typically ranges from 8.7 to 10.3. The pH value of the solution for crystal growth typically ranges from 5 to 7. For this reason, protective layer 36 and crystal nuclei of ZnO are charged to a positive potential in the solution for crystal growth. This configuration prevents the crystal nuclei of ZnO from being attached to protective layer 36, and prevents ZnO sufficiently from being formed. The number of the ZnO particles formed at the portion exposed to the outside of the surface of protective layer 36 is, for example, equal to or fewer than 30 per the area of 1 $mm^2$ of the portion. The number of the ZnO particles formed at the portion exposed to the outside of the surface of protective layer 36 may equal to or fewer than 10 per the area of 1 $mm^2$ of the portion. Since ZnO particles are prevented from being formed, the foreign substances are prevented from being generated when substrate 30, metal layer 32, dielectric layer 34, and protective layer 36 are cut. In other words, foreign substances are prevented from being attached to the wavelength conversion device.

(Modified Method for Manufacturing Wavelength Conversion Device)

Figure 4A:
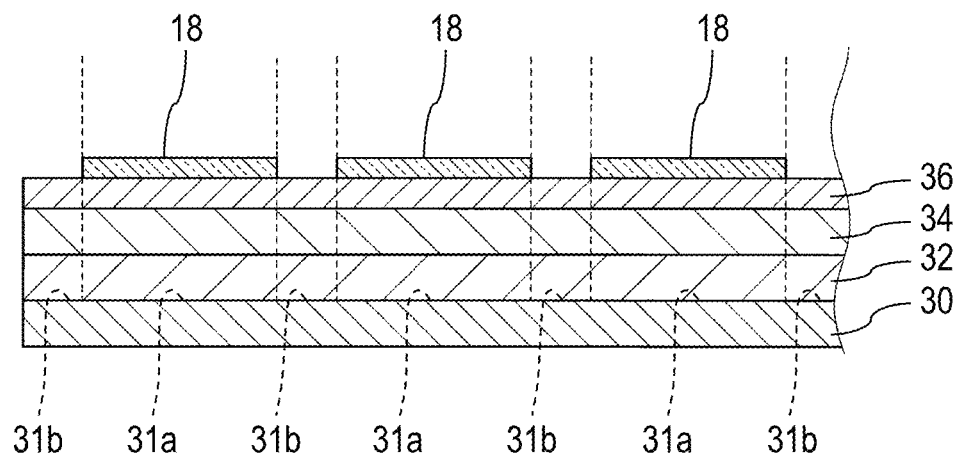
FIG. 4A illustrates the device the mask illustrated in FIG. 3E with the mask removed.
Figure 4B:
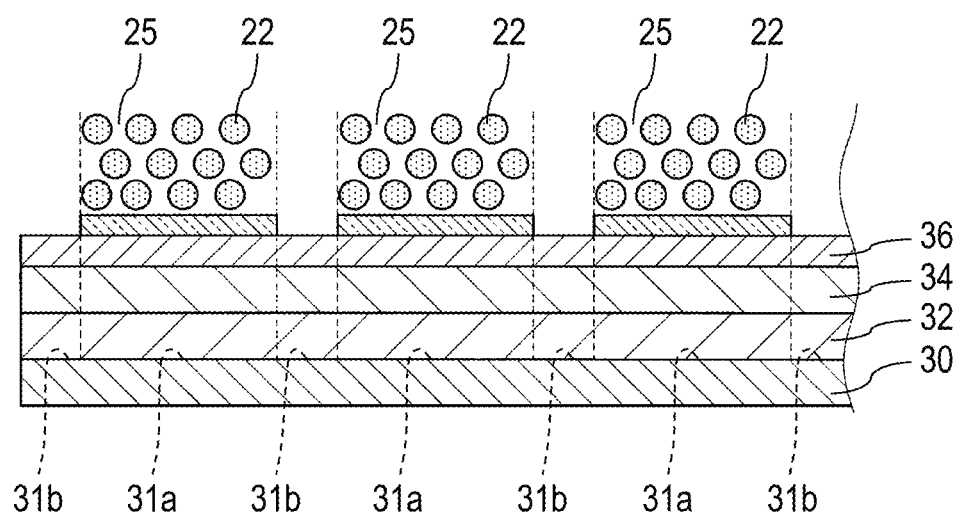
FIG. 4B illustrates precursor layers of phosphor layers formed on the seed crystal layers illustrated in FIG. 4A.

FIGS. 4A and 4B illustrate another method for manufacturing wavelength conversion device 100. In the method for manufacturing wavelength conversion device 100, precursor layers 25 may be formed after mask 40 is removed. For example, as illustrated in FIG. 4A, mask 40 is removed after seed crystal layers 18 are formed. Next, as illustrated in FIG. 4B, precursor layers 25 are formed on seed crystal layers 18, respectively. As a method for forming precursor layers 25, for example, a thick film forming method, such as a printing method using a printing plate, such as a screen plate or a metal mask plate for patterning phosphor particles 22, can be utilized.

(Another Modified Method for Manufacturing Wavelength Conversion Device)

In the method for manufacturing wavelength conversion device 100, seed crystal layers 18 may be formed without using mask 40. For example, a crystalline ZnO thin film is formed on protective layer 36. The ZnO thin film covers first regions 31a and second region 31b. As a method for forming the ZnO thin film, the above-described printing method or vapor phase film formation methods can be utilized. Next, seed crystal layers 18 can be formed by etching the ZnO thin film. Examples of the etching include wet etching. As an etching solution, for example, aqueous solutions of hydrochloric acid, acetic acid, citric acid, and the like can be utilized.

Exemplary Embodiment 2

Figure 5:
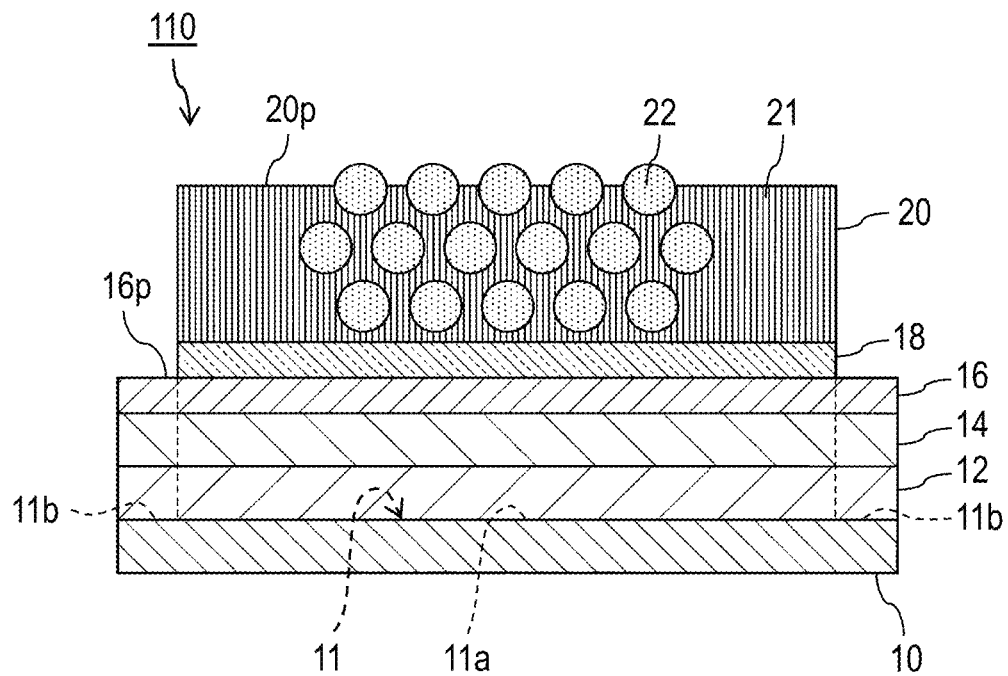
FIG. 5 is a schematic sectional diagram of a wavelength conversion device according to Exemplary Embodiment 2 of the disclosure.

FIG. 5 is a schematic sectional diagram of wavelength conversion device 110 according to Exemplary Embodiment 2 of the disclosure. As illustrated in FIG. 5, phosphor particles 22 of wavelength conversion device 110 according to Embodiment 2 are locally dispersed in matrix 21. Surfaces of parts of phosphor particles 22 contained in phosphor layer 20 are partially exposed from the upper surface of phosphor layer 20. The structure of wavelength conversion device 110 is the same as the structure of wavelength conversion device 100 of Embodiment 1 except the above. Accordingly, elements common to wavelength conversion device 100 of Embodiment 1 and wavelength conversion device 110 of the present embodiment are denoted by the same reference numerals, and the description of the elements may be omitted. In other words, the following description regarding the respective embodiments can be applied to each other unless there is technical contradiction. Furthermore, the embodiments may be combined with each other unless there is technical contradiction.

Wavelength conversion device 110 can be fabricated by the following method. First, seed crystal layer 18 is formed on protective layer 36 by the same method as in manufacturing wavelength conversion device 100. Next, precursor layer 25 is formed on seed crystal layer 18 so that the area of the main surface of precursor layer 25 is smaller than the area of the main surface of seed crystal layer 18. The ratio (A2/A1) of area A2 of the main surface of precursor layer 25 to area A1 of the main surface of seed crystal layer 18 is, for example, equal to or larger than 0.7 and equal to or smaller than 1.0. Next, matrix 21 is formed by the same method as manufacturing wavelength conversion device 100. Phosphor layer 20 in which phosphor particles 22 are locally dispersed in matrix 21 is obtained. By appropriately adjusting the conditions for forming matrix 21, it is possible to obtain phosphor layer 20 in which the surface of part of phosphor particles 22 is partially exposed from the upper surface of phosphor layer 20.

Exemplary Embodiment 3

Figure 6:
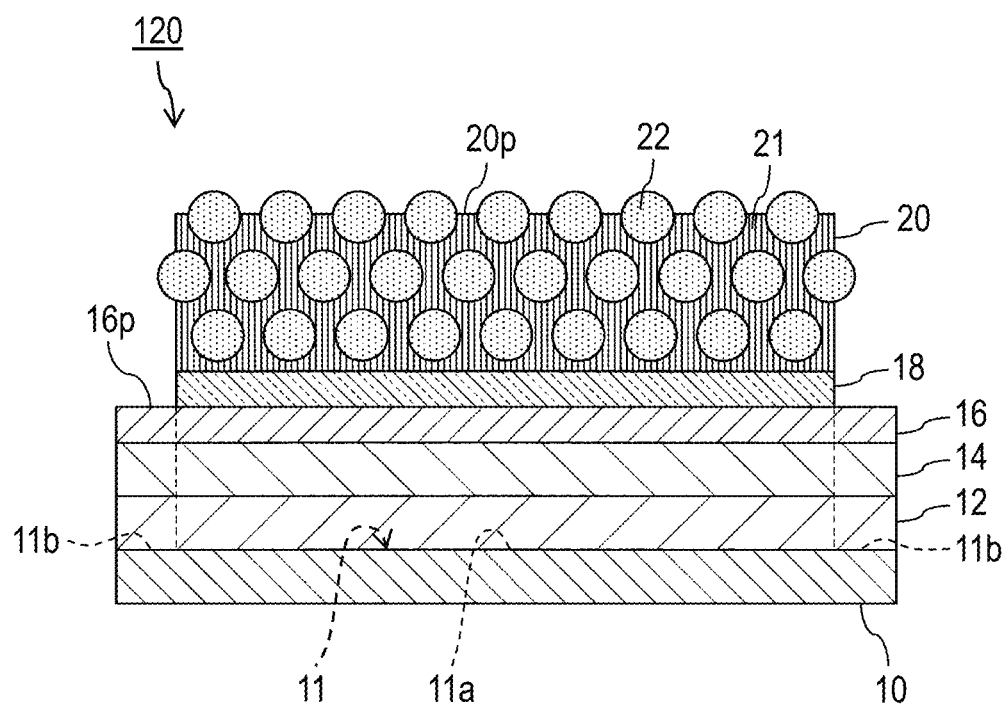
FIG. 6 is a schematic sectional diagram of a wavelength conversion device according to Exemplary Embodiment 3 of the disclosure.

FIG. 6 is a schematic sectional diagram of wavelength conversion device 120 according to Exemplary Embodiment 3 of the disclosure. As illustrated in FIG. 6, phosphor particles 22 of wavelength conversion device 120 according to Embodiment 3 are dispersed entirely in matrix 21. Surfaces of parts of phosphor particles 22 contained in phosphor layer 20 are partially exposed from the side surface of phosphor layer 20. The structure of wavelength conversion device 120 is the same as the structure of wavelength conversion device 110 of Embodiment 2 except the above.

Wavelength conversion device 120 can be fabricated by the following method. First, seed crystal layer 18 is formed on protective layer 36 by the same method as the method for manufacturing wavelength conversion device 100. Next, precursor layer 25 is formed on seed crystal layer 18 so that the area of the main surface of precursor layer 25 is larger than the area of the main surface of seed crystal layer 18. Next, matrix 21 is formed by the same method as in the method for manufacturing wavelength conversion device 100. This provides phosphor layer 20 in which the surface of part of phosphor particles 22 is partially exposed from the side surface of phosphor layer 20.

Exemplary Embodiment 4

Figure 7:
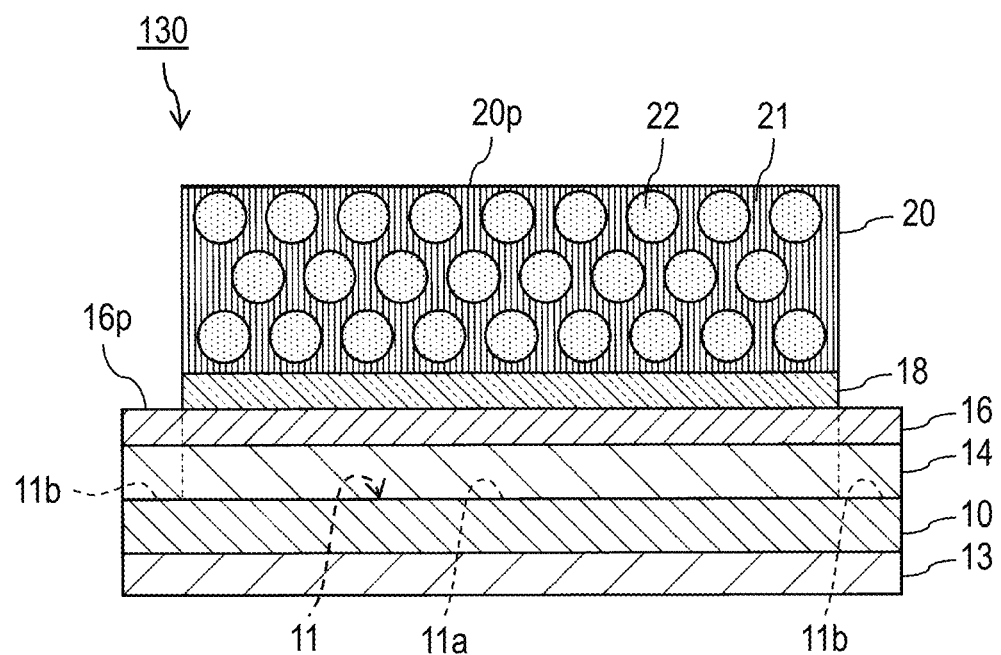
FIG. 7 is a schematic sectional diagram of a wavelength conversion device according to Exemplary Embodiment 4 of the disclosure.

FIG. 7 is a schematic sectional diagram of wavelength conversion device 130 according to Exemplary Embodiment 4 of the disclosure. Wavelength conversion device 100 of Embodiment 1 may not necessarily include metal layer 12. As illustrated in FIG. 7, wavelength conversion device 130 according to Embodiment 4 does not include a metal layer. For this reason, wavelength conversion device 130 can be suitably used in a transmissive light source.

Wavelength conversion device 130 may further include antireflection layer 13. In the thickness direction of substrate 10, antireflection layer 13, substrate 10, dielectric layer 14, protective layer 16, seed crystal layer 18, and phosphor layer 20 are arranged in this order. Substrate 10 contacts antireflection layer 13 and dielectric layer 14.

Substrate 10 of wavelength conversion device 130 exhibits translucency for, e.g. excitation light. Dielectric layer 14 of wavelength conversion device 130 that can be used in a transmissive light source functions as, for example, a dichroic mirror disposed between substrate 10 and phosphor layer 20. For example, the dichroic mirror can transmit light having a cutoff wavelength not shorter than 470 nm, and reflect light having a wavelength equal to or longer than 470 nm. In other words, the dichroic mirror transmits the excitation light and can efficiently reflect the light radiated from phosphor particles 22.

Antireflection layer 13 can suppress reflection of light having a wavelength, e.g. shorter than 470 nm. In other words, antireflection layer 13 can efficiently transmit excitation light. The material of antireflection layer 13 may be one of above-listed materials of dielectric layer 14. Antireflection layer 13 may be composed of plural films. In other words, the films may be layered in antireflection layer 13. The films have different compositions.

(Example of Light Source)

Figure 8:
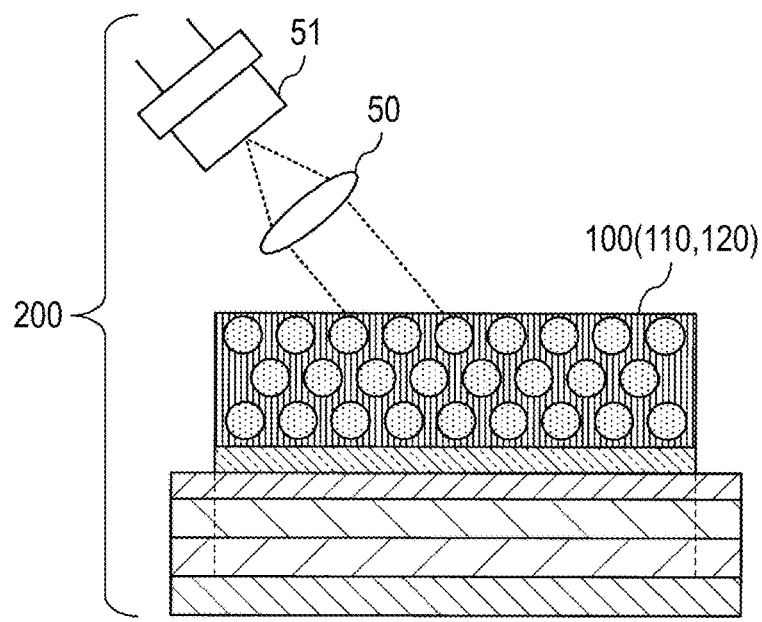
FIG. 8 is a schematic sectional diagram of a reflective light source including a wavelength conversion device of the present disclosure.

FIG. 8 is a schematic sectional diagram of light source 200 including the wavelength conversion device of the present disclosure. Light source 200 is a reflective light source. As illustrated in FIG. 8, light source 200 of the embodiment includes wavelength conversion device 100 and light emitting element 51. Phosphor layer 20 of wavelength conversion device 100 is located between light emitting element 51 and substrate 10 of wavelength conversion device 100. Light source 200 is a reflective light source. Wavelength conversion device 110 described with reference to FIG. and wavelength conversion device 120 described with reference to FIG. 6 can also be used instead of wavelength conversion device 100. A combination of these wavelength conversion devices 100, 110, and 120 can also be used in light source 200.

Light emitting element 51 radiates excitation light. Light emitting element 51 is typically a semiconductor light emitting element. The semiconductor light emitting element is, for example, a light emitting diode (LED), a super luminescent diode (SLD), or a laser diode (LD).

Light emitting element 51 may be composed of one LD or plural LDs. The LDs may be optically coupled. Light emitting element 51 radiates blue light, for example. In the present disclosure, blue light has a peak wavelength ranging from 420 nm to 470 nm.

Light source 200 further includes optical system 50. Optical system 50 may be located on the optical path of the excitation light radiated from light emitting element 51. Optical system 50 includes optical components such as a lens, a mirror, and an optical fiber.

Figure 9:
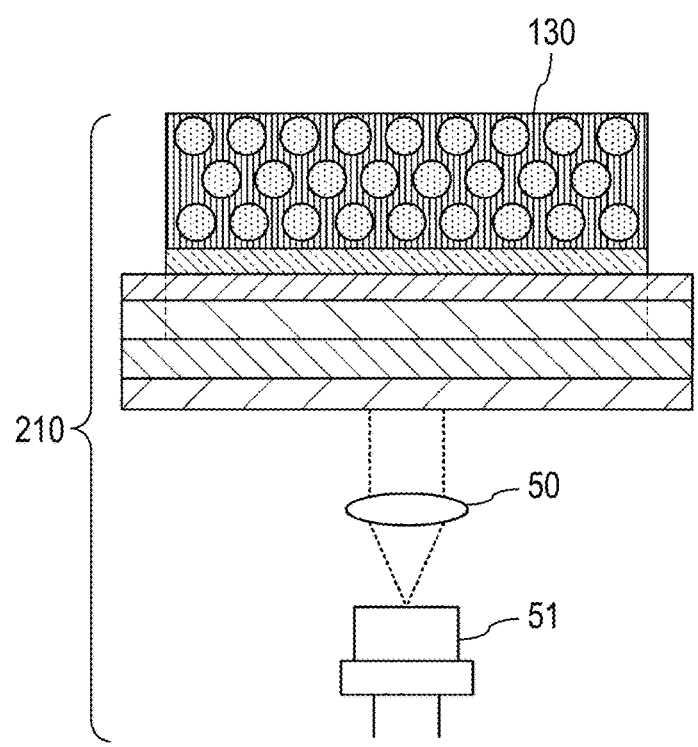
FIG. 9 is a schematic sectional diagram of a transmissive light source using a wavelength conversion device of the present disclosure.

FIG. 9 is a schematic sectional diagram of light source 210 including a wavelength conversion device of the present disclosure. Light source 210 is a transmissive light source. As illustrated in FIG. 9, light source 210 of the embodiment includes wavelength conversion device 130 and light emitting element 51. Light emitting element 51 faces antireflection layer 13 of wavelength conversion device 130. The light from light emitting element 51 passes through substrate 10 and reaches phosphor layer 20. Light source 210 is a transmissive light source.

Figure 10:
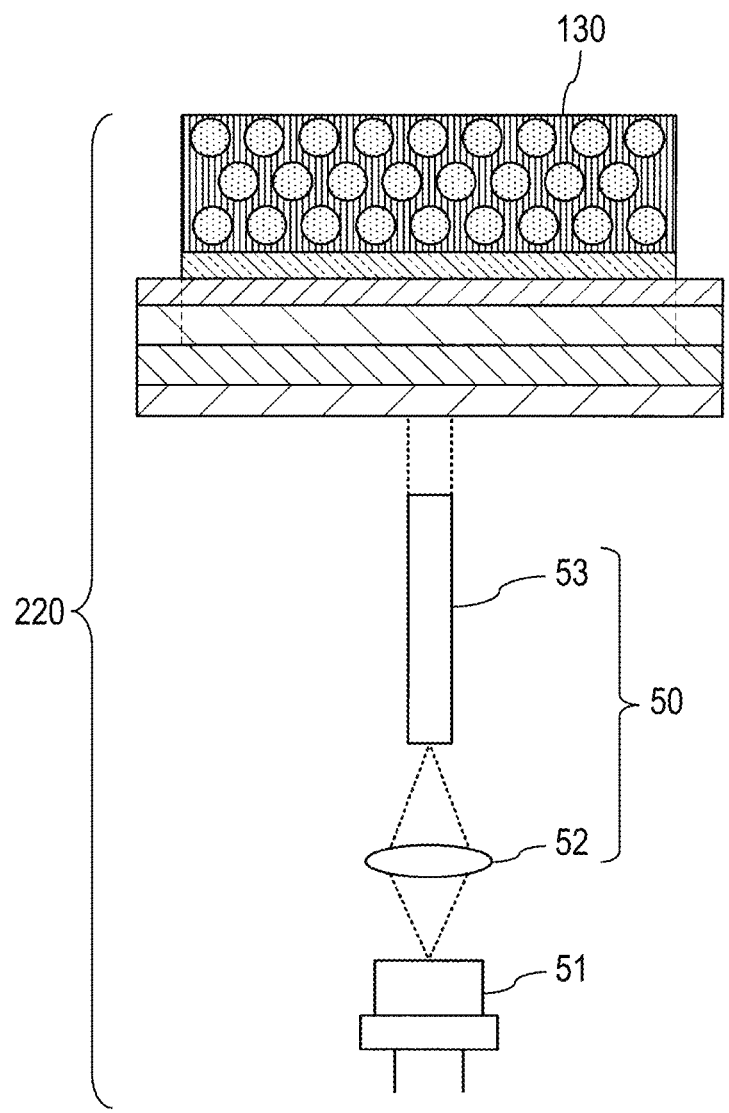
FIG. 10 is a schematic sectional diagram of a transmissive light source using a wavelength conversion device of the present disclosure.

FIG. 10 is a schematic sectional diagram of light source 220 including a wavelength conversion device of the present disclosure. Light source 220 is a transmissive light source. As illustrated in FIG. 10, optical system 50 of light source 220 of the embodiment includes lens 52 and optical fiber 53. Light source 220 is a specific example of light source 210. Lens 52 is, for example, a condenser lens. Optical fiber 53 may be composed of a single fiber or plural fibers. Optical fiber 53 is disposed between lens 52 and wavelength conversion device 130. The excitation light radiated from light emitting element 51 is collected by lens 52. The condensed light is incident on one end of optical fiber 53. The light incident on optical fiber 53 is emitted from the other end of optical fiber 53. The light emitted from optical fiber 53 reaches wavelength conversion device 130.

(Example of Illumination Device)

Figure 11:
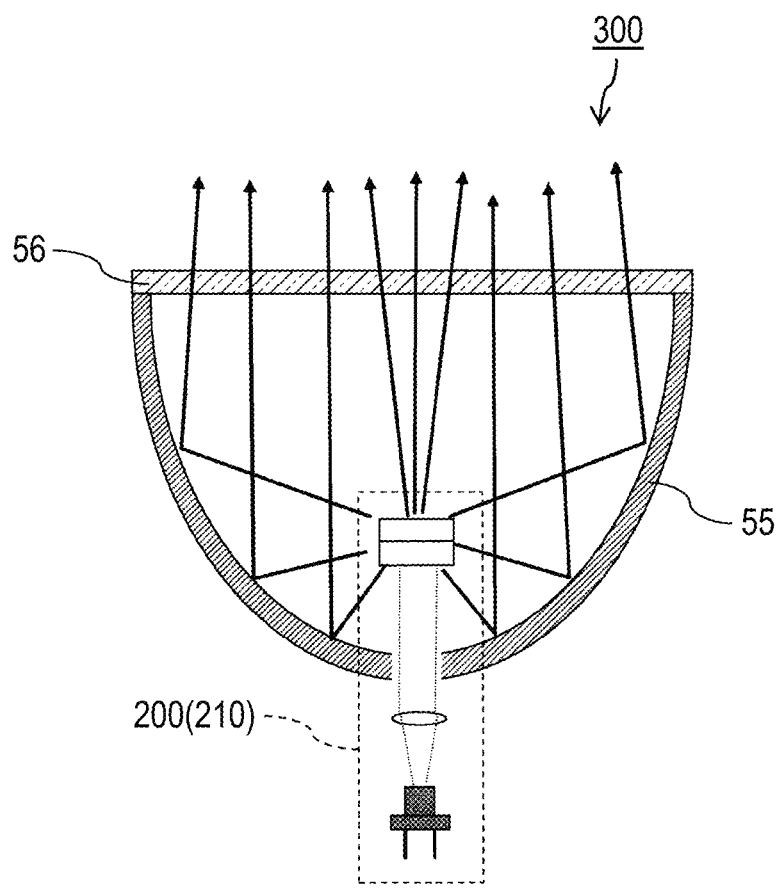
FIG. 11 is a schematic diagram of an illumination device including a light source of the present disclosure.

FIG. 11 is a schematic configuration diagram of illumination device 300 including a light source of the present disclosure. As illustrated in FIG. 11, illumination device 300 of the embodiment includes light source 200 and optical component 55. Light source 210 described with reference to FIG. 9 can also be used instead of light source 200. Optical component 55 guides light radiated from light source 200 forward and is specifically a reflector. Optical component 55 includes, for example, a metal film of Al, Ag or the like or an Al film having a dielectric layer formed at a surface thereof. Filter 56 may be located in front of light source 200. Filter 56 absorbs or scatters blue light so that coherent blue light from the light emitting element of light source 200 is not directly emitted to the outside. Illumination device 300 may be of so-called reflector type or projector type. Illumination device 300 is, for example, a headlamp for vehicles.

Figure 12:
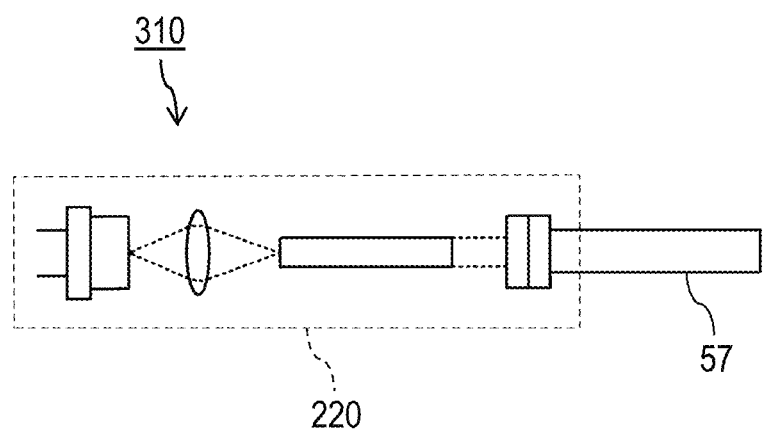
FIG. 12 is a schematic sectional diagram of an illumination device including a light source of the present disclosure.

FIG. 12 is a schematic sectional diagram of illumination device 310 including a light source of the present disclosure. As illustrated in FIG. 12, illumination device 310 of the embodiment includes light source 220 and optical component 57. Optical component 57 guides light radiated from light source 220 to the outside and is specifically an optical fiber. Optical component 57 may be composed of a single fiber or plural fibers. The light radiated from light source 220 is incident on one end of an optical fiber (optical component 57). The light incident on the optical fiber is emitted from the other end of the optical fiber. Illumination device 310 is, for example, endoscope lights.

EXAMPLES

The present disclosure will be specifically described with reference to Examples. However, the present disclosure is not limited to the following Examples.

Example 1

First, a layered body including a substrate, a metal layer, and a dielectric layer was prepared. As the layered body, an Ag mirror (manufactured by KEIHIN KOMAKU KOGYO CO., LTD.) was used. In the Ag mirror, the substrate was made of silicon. The metal layer was made of Ag. In the dielectric layer, plural films were layered. Specifically, an $Al_2O_3$ film, an $SiO_2$ film, a TiO2 film, and an $SiO_2$ film were arranged in this order in the thickness direction of the dielectric layer. The film of the plural films which is farthest from the substrate (a film having a surface exposed to the outside) was the $SiO_2$ film. A main surface of the substrate included plural first regions and a second region surrounding the first regions. The dielectric layer and the metal layer covered the first regions and the second region.

Next, a protective layer was formed on the dielectric layer. The protective layer was fabricated by a vapor phase film formation method. The protective layer was made of $Al_2O_3$. The thickness of the protective layer was 20 nm. The protective layer covered the first regions and the second region.

Next, a metal mask was disposed on the protective layer. The mask had plural openings therein. The openings overlapped the first regions on the main surface of the substrate, respectively. Next, ZnO thin films serving as seed crystal layers were formed in the openings. The seed crystal layers were fabricated by a vapor phase film formation method. The temperature of the substrate when forming the ZnO thin films was 300° C. Each seed crystal layer was a polycrystalline ZnO film. The polycrystalline ZnO was oriented in a c-axis. The thickness of the seed crystal layer was 150 nm. After the ZnO thin films were formed, the metal mask was removed.

Next, a metal mask was disposed on the substrate on which layers including the seed crystal layers had been disposed. In detail, the metal mask was disposed on the protective layer. The mask had plural openings therein. The openings overlapped the first regions on the main surface of the substrate, respectively. In other words, the openings overlapped the seed crystal layers, respectively. Next, a coating liquid containing phosphor particles was prepared. The material of the phosphor particles was YAG. The average particle diameter of the phosphor particles was 4.3 μm. The coating liquid was applied onto the seed crystal layers by a printing method. Precursor layers were thus formed on the seed crystal layers, respectively. After the precursor layers were formed, the metal mask was removed.

Next, crystalline matrixes were fabricated on the ZnO thin films by a solution growth method after the mask was removed from the substrate. A chemical bath deposition method was used as a solution growth method for ZnO to be the matrix. An aqueous solution having zinc nitrate (0.1 mol/L) and hexamethylenetetramine (0.1 mol/L) were dissolved was prepared as a ZnO growth solution. The pH value of the ZnO growth solution was adjusted to 6.5 by adding ammonia water to the ZnO growth solution. The concentration of ammonia in the ammonia water was 28% by mass. The substrate on which the phosphor particles had been disposed was immersed in the ZnO growth solution accommodated in a container. At this moment, the main surface of the substrate was perpendicular to the bottom surface of the container. A crystal of c-axis oriented ZnO matrix was grown between the phosphor particles by maintaining the temperature of the ZnO growth solution at 80° C. Next, the substrate was taken out from the ZnO growth solution and washed with pure water. Next, excess phosphor particles were removed by polishing and washing the surfaces of the phosphor layers, thereby providing phosphor layers. The phosphor layers were formed above the first regions. The thickness of the phosphor layer was 30 μm. Foreign substances were not attached to the phosphor layer. Next, the substrate, the metal layer, the dielectric layer, and the protective layer were cut along plural cutting lines defined in the second region so that the phosphor layers were separated from each other. Example 1 of the wavelength conversion device was thus obtained.

Example 2

Example 2 of the wavelength conversion device was obtained by the same method as Example 1 except that the thickness of the protective layer was to 50 nm.

Comparative Example 1

Comparative Example 1 of the wavelength conversion device was obtained by the same method as Example 1 except that the protective layer was not formed.

Comparative Example 2

Comparative Example 2 of the wavelength conversion device of was obtained by the same method as in Comparative Example 1 except that the ZnO thin film was formed without using a mask. In Comparative Example 2 of the wavelength conversion device, the ZnO thin film and the matrix covered the first regions and the second region. The phosphor particles were disposed above the first region.
(Observation Under Microscope)

Figure 13:
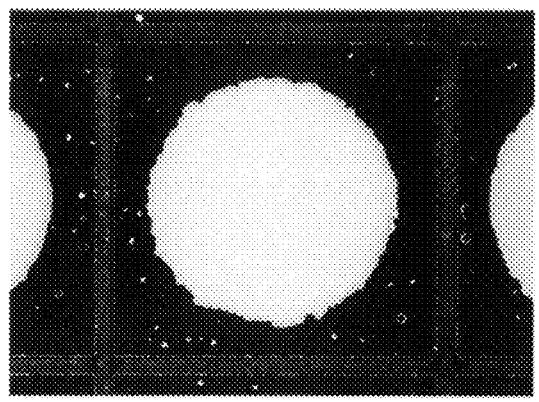
FIG. 13 illustrates a microscope image of a surface of Example 1 of the wavelength conversion device.
Figure 14:
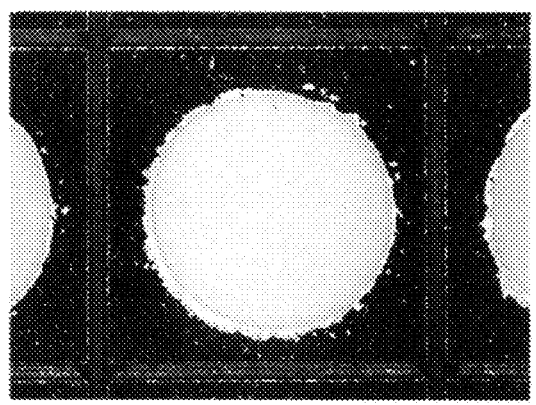
FIG. 14 illustrates a microscope image of a surface of Example 2 of the wavelength conversion device.
Figure 15:
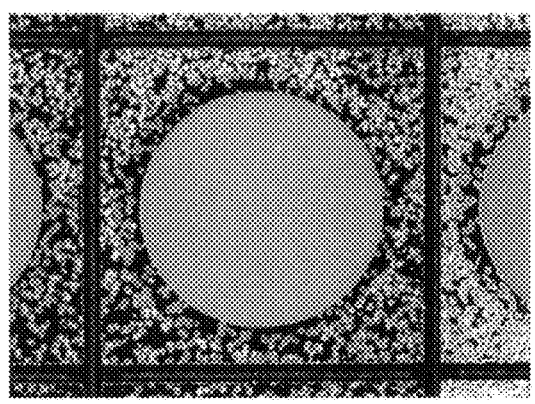
FIG. 15 illustrates a microscope image of a surface of Comparative Example 1 of the wavelength conversion device.
Figure 16:
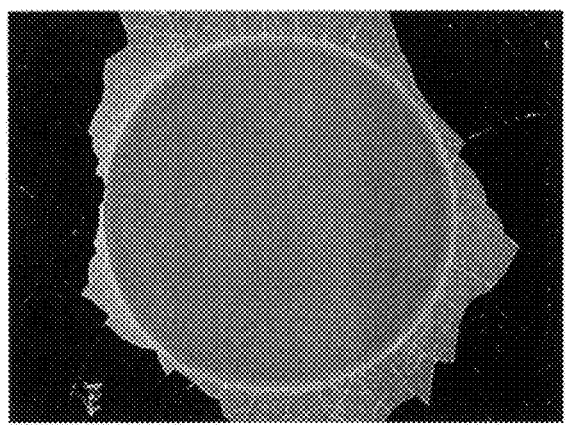
FIG. 16 illustrates a microscope image of a surface of Comparative Example 2 of the wavelength conversion device.

The surfaces of Examples and Comparative Examples of the wavelength conversion devices were observed with a microscope. As the microscope, a digital microscope VH-5000 manufactured by KEYENCE CORPORATION was used. Microscope images captured are illustrated in FIGS. 13 to 16. As shown in FIG. 15, a lot of ZnO particles were generated in the vicinity of the phosphor layer of Comparative Example 1 of the wavelength conversion device. The ZnO particles were located on the dielectric layer. In Comparative Example 1, the ZnO particles were cut together with the dielectric layer, and thus, foreign substances were attached to the wavelength conversion device obtained. As shown in FIG. 16, the generation of ZnO particles was suppressed in Comparative Example 2 of the wavelength conversion device. However, a matrix having substantially the same thickness as the phosphor layer was formed over the second region. For this reason, in Comparative Example 2 of the wavelength conversion device, the phosphor layer has cracks as the matrix was cut together with the dielectric layer. In Comparative Example 2, part of the matrix was scattered when the matrix was cut. Part of the scattered matrix was attached to the wavelength conversion device as foreign substances. In contrast, as shown in FIGS. 13 and 14, the generation of ZnO particles was suppressed in Examples 1 and 2 the wavelength conversion devices.

Next, the number of ZnO particles in Examples 1 and 2 and Comparative Example 1 of the wavelength conversion devices was counted. In these wavelength conversion devices, some of the ZnO particles contact each other to form an aggregate particle. For such aggregate particles each made of ZnO particles, the number of ZnO particles constituting the aggregate particles was counted. In Example 1, the number of ZnO particles formed at the portion located above the second region of the surface of the protective layer was 3.4 particles per the area of 1 $mm^2$ of the portion. In Example 2, the number of ZnO particles formed at the portion located above the second region of the surface of the protective layer was 3.1 per the area of 1 $mm^2$ of the portion.

In contrast, in Comparative Example 1, the number of ZnO particles formed at the portion located above the second region of the surface of the dielectric layer was 109 per the area of 1 mm$^2$ of the portion. In Examples 1 and 2, the generation of ZnO particles was suppressed and the ZnO particles and the matrix were not cut, and thus preventing foreign substances from being attached to the wavelength conversion devices.

(Observation Results of ZnO Particles)

Figure 17:
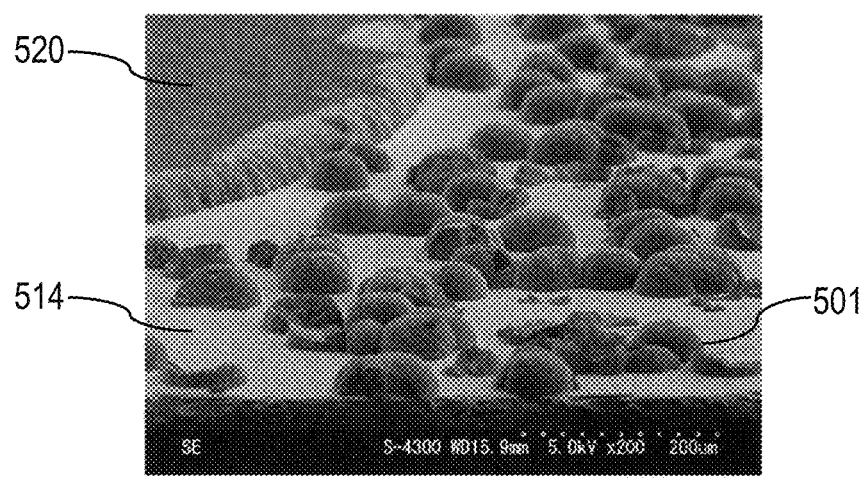
FIG. 17 illustrates a scanning electron microscope image of a surface of Comparative Example 1 of the wavelength conversion device.

Next, the surface of the wavelength conversion device of Comparative Example 1 was observed with a scanning electron microscope (SEM). The SEM image captured is illustrated in FIG. 17. FIG. 17 illustrates plural ZnO particles 501 formed on dielectric layer 514 and a part of phosphor layer 520. As shown in FIG. 17, each ZnO particle 501 had a hemispherical shape.

Figure 18:
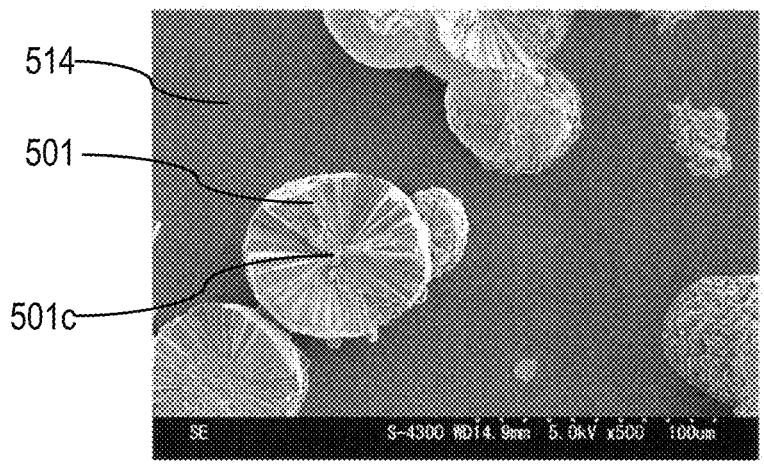
FIG. 18 illustrates a scanning electron microscope image of a cross section of ZnO particles on a surface of Comparative Example 1 f the wavelength conversion device.
Figure 18:
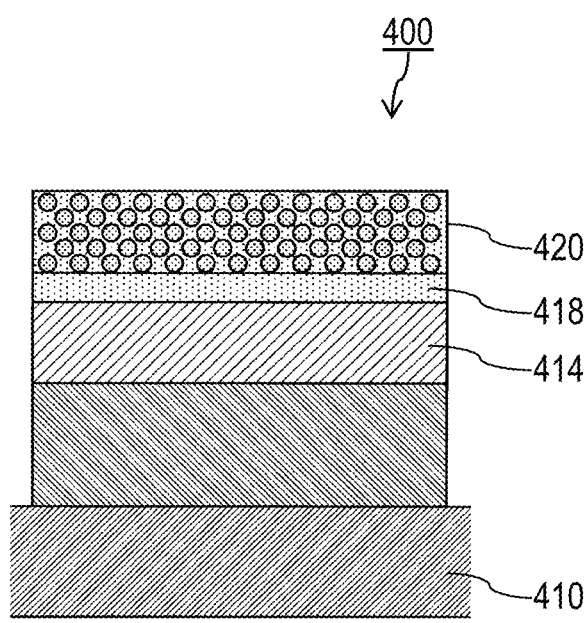

Next, ZnO particles 501 were cut in the vicinity of the surface of dielectric layer 514 so that a cross section parallel to the surface was obtained. The cut surface of ZnO particle 501 was observed under SEM. The SEM image attained is illustrated in FIG. 18. As shown in FIG. 18, ZnO crystals radially grew from the vicinity of center 501C of the cross section of ZnO particles 501.

(High Temperature Test)

In a case that a matrix of a wavelength conversion device is formed by a solution growth method, the matrix may contain impurities, such as water. For this reason, in a case when the wavelength conversion device is heated, impurities may volatilize and the matrix may shrink, thereby providing stress at the boundary between the protective layer and the seed crystal layer or at the boundary between the dielectric layer and the seed crystal layer. This stress may cause the seed crystal layer and the phosphor layer to be peeled off from the substrate. For this reason, the peeling off of the phosphor layer from the substrate can be evaluated by a high temperature test. The results attained by subjecting Examples 1 and 2 and Comparative Example 1 of the wavelength conversion devices to the high temperature test will be described below.

Measurement Example 1

First, Example 1 of two wavelength conversion devices were disposed in a firing furnace. The temperature in the firing furnace was 20° C. Next, the temperature in the firing furnace was raised to a set temperature at a rate of 200° C./h. The set temperature was 220° C. The temperature in the firing furnace was maintained at the set temperature for 1 hour. Next, the temperature in the firing furnace was lowered to 20° C. at a rate of 200° C./h.

Next, a reflective light source (see FIG. 8) was fabricated with the wavelength conversion device taken out from the firing furnace. The reflective light source had a metal housing for holding the substrate of the wavelength conversion device. The wavelength conversion device was irradiated with excitation light while the housing was air-cooled with a fan. LD was used as the excitation light source. The wavelength of excitation light was 446 nm. The area irradiated with excitation light was 0.206 mm$^2$. The output of LD was 0.21 W. The temperature of the surface of the phosphor layer at this moment was measured by infrared thermography. Next, the output of LD was changed, and the temperature of the surface of the phosphor layer was measured again. As the infrared thermography, FLIR T640 (manufactured by FLIR Systems Japan) was used. The wavelength conversion devices used are defined as Samples 1 and 2. The output value of LD and the temperature (° C.) of the surface of the phosphor layer at that value are shown in Table 1.

Measurement Example 2

A high temperature test in Measurement Example 2 was performed by the same method as in Measurement Example 1 except that Example 2 of the wavelength conversion device was used instead of Example 1 of the wavelength conversion device. The wavelength conversion devices used are defined as Samples 3 and 4. After the high temperature test, the wavelength conversion device was irradiated with excitation light. The results attained are shown in Table 1.

Measurement Example 3

A high temperature test in Measurement Example 3 was performed by the same method as in Measurement Example 1 except that Comparative Example 1 of the wavelength conversion device was used instead of Example 1 of the wavelength conversion device. The wavelength conversion devices used are defined as Samples 5 and 6. After the high temperature test, the wavelength conversion device was irradiated with excitation light. The results attained are shown in Table 1.

TABLE 1

| Output of LD | Example 1 | | Example 2 | | Comparative Example 1 | |
| --- | --- | --- | --- | --- | --- | --- |
| (W) | Sample 1 | Sample 2 | Sample 3 | Sample 4 | Sample 5 | Sample 6 |
| 0.21 | 27.1° C. | 27.8° C. | 28.7° C. | 28.7° C. | 26.2° C. | 27.2° C. |
| 0.85 | 33.0° C. | 34.2° C. | 34.4° C. | 34.7° C. | 33.2° C. | 34.2° C. |
| 1.46 | 40.3° C. | 42.0° C. | 40.8° C. | 42.0° C. | 40.3° C. | 41.2° C. |
| 2.04 | 47.4° C. | 49.5° C. | 47.3° C. | 49.0° C. | 47.5° C. | 48.9° C. |
| 2.59 | 54.4° C. | 58.0° C. | 54.2° C. | 56.2° C. | 54.8° C. | 56.3° C. |
| 2.98 | 60.1° C. | 65.0° C. | 60.7° C. | 62.5° C. | 61.2° C. | 63.2° C. |
| Peeled off | No | No | No | No | No | No |

As shown in the results in Table 1, in Examples 1 and 2 and Comparative Example 1 of the wavelength conversion devices (Samples 1 to 6), the temperature of the surface of the phosphor layer was lower than 100° C. even in a case that the output of LD was changed to 2.98 W. From this result, it is estimated that the heat of the phosphor layer can be released to the substrate in Samples 1 to 6. In other words, the phosphor layer did not peel off from the substrate in Samples 1 to 6.

Measurement Example 4

A high temperature test in Measurement Example 4 was performed by the same method as in Measurement Example 1 except that the set temperature was changed to 300° C. The wavelength conversion devices used are defined as Samples 7 and 8. After the high temperature test, the wavelength conversion device was irradiated with excitation light. The output value of LD and the temperature (° C.) of the surface of the phosphor layer at that value are shown in Table 2. The results attained are collectively shown in Table 2.

Measurement Example 5

A high temperature test in Measurement Example 5 was performed by the same method as in Measurement Example 4 except that Example 2 of the wavelength conversion device was used instead of Example 1 of the wavelength conversion device. The wavelength conversion devices used are defined as Samples 9 and 10. After the high temperature test, the wavelength conversion device was irradiated with excitation light. The results attained are shown in Table 2.

Measurement Example 6

A high temperature test in Measurement Example 6 was performed by the same method as in Measurement Example 4 except that Comparative Example 1 of the wavelength conversion device was used instead of Example 1 of the wavelength conversion device. The wavelength conversion devices used are defined as Samples 11 and 12. After the high temperature test, the wavelength conversion device was irradiated with excitation light. The results attained are shown in Table 2.

conversion device (Samples 11 and 12), the temperature of the surface of the phosphor layer was higher than 100° C. when the output of LD was changed to 1.46 W. From this result, it is estimated that the heat of the phosphor layer cannot be released to the substrate in Samples 11 and 12. In other words, the phosphor layer was peeled off from the substrate in Samples 11 and 12. In detail, the seed crystal layer was peeled off from the dielectric layer. As shown in the results in Table 2, in Examples 1 and 2 of the wavelength conversion devices, the phosphor layer is prevented from being peeled off from the substrate in contrast to compared with Comparative Example 1 of the wavelength conversion device. In other words, an adhesive force between the seed crystal layer and the protective layer is larger than an adhesive force between the seed crystal layer and the dielectric layer.

Measurement Example 7

A high temperature test in Measurement Example 7 was performed by the same method as in Measurement Example 1 except that the set temperature was changed to 400° C. The wavelength conversion devices used are defined as Samples 13 and 14. After the high temperature test, the wavelength conversion device was irradiated with excitation light. The output value of LD and the temperature (° C.) of the surface of the phosphor layer at that value are shown in Table 3. The results attained are collectively shown in Table 3.

Measurement Example 8

A high temperature test in Measurement Example 8 was performed by the same method as in Measurement Example 7 except that Example 2 of the wavelength conversion device was used instead of Example 1 of the wavelength conversion device. The wavelength conversion devices used are defined as Samples 15 and 16. After the high temperature test, the wavelength conversion device was irradiated with excitation light. The results attained are shown in Table 3.

Measurement Example 9

A high temperature test in Measurement Example 9 was performed by the same method as in Measurement Example

TABLE 2

| Output of LD | Example 1 | | Example 2 | | Comparative Example 1 | |
|---|---|---|---|---|---|---|
| (W) | Sample 7 | Sample 8 | Sample 9 | Sample 10 | Sample 11 | Sample 12 |
| 0.21 | 27.5° C. | 28.3° C. | 29.2° C. | 26.0° C. | 38.0° C. | 40.0° C. |
| 0.85 | 33.9° C. | 35.0° C. | 35.4° C. | 33.0° C. | 82.3° C. | 90.0° C. |
| 1.46 | 41.0° C. | 42.5° C. | 42.2° C. | 40.6° C. | 133.0° C. | 145.0° C. |
| 2.04 | 48.0° C. | 50.1° C. | 49.3° C. | 48.0° C. | — | — |
| 2.59 | 55.6° C. | 58.2° C. | 56.4° C. | 56.1° C. | — | — |
| 2.98 | 62.2° C. | 64.9° C. | 62.5° C. | 62.6° C. | — | — |
| Peeled off | No | No | No | No | Yes | Yes |

As shown in the results in Table 2, in Examples 1 and 2 of the wavelength conversion devices (Samples 7 to 10), the temperature of the surface of the phosphor layer was lower than 100° C. even in a case that the output of LD was changed to 2.98 W. In other words, the phosphor layer did not peel off from the substrate in Samples 7 to 10. In contrast, in Comparative Example 1 of the wavelength 7 except that Comparative Example 1 of the wavelength conversion device was used instead of Example 1 of the wavelength conversion device. The wavelength conversion devices used are defined as Samples 17 and 18. After the high temperature test, the wavelength conversion device was irradiated with excitation light. The results attained are shown in Table 3.

TABLE 3

| Output of LD | Example 1 | | Example 2 | | Comparative Example 1 | |
|---|---|---|---|---|---|---|
| (W) | Sample 13 | Sample 14 | Sample 15 | Sample 16 | Sample 17 | Sample 18 |
| 0.21 | 28.1° C. | 29.7° C. | 32.8° C. | 27.5° C. | 41.0° C. | 40.5° C. |
| 0.85 | 33.9° C. | 35.5° C. | 38.5° C. | 32.5° C. | 91.0° C. | 88.4° C. |
| 1.46 | 39.7° C. | 39.7° C. | 40.0° C. | 38.6° C. | 150.0° C. | 146.0° C. |
| 2.04 | 46.5° C. | 45.6° C. | 46.6° C. | 44.5° C. | — | — |
| 2.59 | 53.4° C. | 52.4° C. | 52.8° C. | 50.5° C. | — | — |
| 2.98 | 59.2° C. | 57.2° C. | 59.0° C. | 55.8° C. | — | — |
| Peeled off | No | No | No | No | Yes | Yes |

As shown in the results in Table 3, in Examples 1 and 2 of the wavelength conversion devices (Samples 13 to 16), the temperature of the surface of the phosphor layer was lower than 100° C. even in a case that the output of LD was changed to 2.98 W. In other words, the phosphor layer did not peel off from the substrate in Samples 13 to 16. According to the wavelength conversion device of the present disclosure, it can be sufficiently suppressed that the phosphor layer peels off from the substrate as described above.

In the present disclosure, the terms indicating directions, such as "upper surface" and "above" indicate relative directions determined only by the relative positional relationship of the constituent components of the wavelength conversion device, and do not indicate absolute directions, such as a vertical direction.

INDUSTRIAL APPLICABILITY

A wavelength conversion device of the present disclosure may be utilized in a light source in, for example, general illumination devices, such as ceiling lights; special illumination devices, such as spotlights, stadium lighting, and studio lighting; illumination devices, such as headlamps, for vehicles; projection devices, such as projectors and head-up displays; endoscope lights for medical or industrial use; imaging devices such as digital cameras, cell phones, and smartphones; and liquid crystal display devices, such as personal computer (PC) monitors, lap-top personal computers, televisions, personal digital assistants (PDXs), smartphones, tablet PCs, and cell phones.

REFERENCE MARKS IN THE DRAWINGS 10, 30 substrate
11, 31 main surface
11a, 31a first region
11b, 31b second region
12, 32 metal layer
14, 34 dielectric layer
16, 36 protective layer
18 seed crystal layer
20 phosphor layer
21 matrix
22 phosphor particle
51 light emitting element
55, 57 optical component
100, 110, 120, 130 wavelength conversion device
200, 210, 220 light source
300, 310 illumination device

The invention claimed is:

1. A wavelength conversion device comprising:
a substrate;
a phosphor layer supported by the substrate, the phosphor layer including a matrix containing zinc oxide and phosphor particles embedded in the matrix;
a dielectric layer disposed between the substrate and the phosphor layer;
a protective layer formed on a surface of the dielectric layer facing the phosphor layer, and
a ZnO layer sandwiched between the protective layer and the phosphor layer,
wherein the protective layer contains at least one selected from the group consisting of $Al_2O_3Si_3N_4$, $Y_2O_3$, NiO, and $La_2O_3$ and
the dielectric layer contains at least one selected from the group consisting of titanium oxide, zirconium oxide, tantalum oxide, cerium oxide, niobium oxide, tungsten oxide, silicon oxide, and magnesium fluoride.

2. The wavelength conversion device according to claim 1, wherein
a main surface of the substrate includes a first region and a second region,
each of the dielectric layer and the protective layer covers the first region and the second region, and
the phosphor layer covers only the first region out of the first region and the second region.

3. The wavelength conversion device according to claim 1, wherein the protective layer mainly contains $Al_2O_3$.

4. The wavelength conversion device according to claim 1, further comprising a metal layer disposed between the substrate and the dielectric layer.

5. The wavelength conversion device according to claim 1, wherein a thickness of the protective layer is equal to or larger than 5 nm and equal to or smaller than 200 nm.

6. A light source comprising:
a light emitting element; and
the wavelength conversion device according to claim 1, the wavelength conversion device being configured to receive excitation light emitted from the light emitting element and radiate fluorescence.

7. An illumination device comprising:
the light source according to claim 6; and
an optical component configured to guide light radiated from the light source to an outside.

8. A method for manufacturing the wavelength conversion device according to claim 1, comprising:
preparing a substrate having a main surface that is an upper surface, the main surface including a plurality of first regions and a second region, each of the plurality of first regions and the second region is covered with a dielectric layer;

forming a protective layer covering the plurality of first regions and the second region;

forming a plurality of phosphor layers provided above the plurality of first regions, respectively, each of the plurality of phosphor layers including a matrix and phosphor particles embedded in the matrix, the matrix containing zinc oxide; and cutting the substrate, the dielectric layer, and the protective layer along a plurality of cutting lines defined in the second region so as to separate the plurality of phosphor layers from each other.

9. The method according to claim 8, wherein said forming the plurality of phosphor layers comprises:

forming a plurality of seed crystal layers containing zinc oxide on the protective layer covering the plurality of first regions, respectively;

disposing the plurality of phosphor particles on each of the plurality of seed crystal layers; and growing crystals of the plurality of seed crystal layers so as to provide the matrix of the each of the plurality of phosphor layers.

10. The method according to claim 9, wherein said growing the crystals of the plurality of seed crystal layers comprises growing the crystals of the plurality of seed crystal layers by a solution growth method so as to provide the matrix of the each of the plurality of phosphor layers.

\* \* \* \* \*